United States Patent
Kozuma et al.

(10) Patent No.: US 10,027,324 B2
(45) Date of Patent: Jul. 17, 2018

(54) SEMICONDUCTOR DEVICE, ELECTRONIC COMPONENT, AND ELECTRONIC DEVICE

(71) Applicant: Semiconductor Energy Laboratory Co., Ltd., Kanagawa-ken (JP)

(72) Inventors: Munehiro Kozuma, Kanagawa (JP); Yoshiyuki Kurokawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/471,516

(22) Filed: Mar. 28, 2017

(65) Prior Publication Data

US 2017/0288670 A1    Oct. 5, 2017

(30) Foreign Application Priority Data

Apr. 1, 2016 (JP) ................................ 2016-073794

(51) Int. Cl.
| | |
|---|---|
| G06F 7/38 | (2006.01) |
| H03K 19/00 | (2006.01) |
| H03K 19/177 | (2006.01) |
| H03K 21/02 | (2006.01) |

(52) U.S. Cl.
CPC ..... *H03K 19/0008* (2013.01); *H03K 19/1776* (2013.01); *H03K 19/17728* (2013.01); *H03K 19/17744* (2013.01); *H03K 21/026* (2013.01)

(58) Field of Classification Search
CPC ......... H03K 19/0008; H03K 19/17728; H03K 19/17744; H03K 19/1776; H03K 21/026
USPC ......................................................... 326/40
See application file for complete search history.

(56) References Cited

U.S. PATENT DOCUMENTS

| | | | |
|---|---|---|---|
| 7,761,755 B1 * | 7/2010 | Payakapan | ....... G01R 31/31922 713/500 |
| 8,207,756 B2 | 6/2012 | Shionoiri et al. | |
| 8,542,034 B2 | 9/2013 | Kato | |
| 8,547,753 B2 | 10/2013 | Takemura et al. | |
| 8,952,722 B2 | 2/2015 | Ikeda et al. | |
| 8,952,723 B2 | 2/2015 | Aoki et al. | |
| 8,970,251 B2 | 3/2015 | Kurokawa | |

(Continued)

FOREIGN PATENT DOCUMENTS

JP    2017-098954 A    6/2017

OTHER PUBLICATIONS

Waidyasooriya, H.M. et al., "Implementation of a Partially Reconfigurable Multi-Context FPGA Based on Asynchronous Architecture," IEICE Trans. Electron. (IEICE Transactions on Electronics), Apr. 1, 2009, vol. E92-C, No. 4, pp. 539-549.

*Primary Examiner* — Daniel D Chang
(74) *Attorney, Agent, or Firm* — Husch Blackwell LLP

(57) ABSTRACT

Skew of a multi-context PLD in context switch is reduced to achieve low power consumption. The frequency of a clock signal is switched in context switch operation in accordance with circuit operation to secure time required for context switch. By returning the frequency of the clock signal to the original frequency after executing the context switch, the PLD can maintain high-speed processing and perform the context switch accurately and safely. The time required for the context switch mainly depends on a hardware structure (circuit layout including a parasitic component). Thus, the reliability in the context switch can be improved when time that is equal to or longer than the longest time required for circuit change is secured.

19 Claims, 18 Drawing Sheets

(56) References Cited

U.S. PATENT DOCUMENTS

| | | |
|---|---|---|
| 8,970,253 B2 | 3/2015 | Kurokawa |
| 9,385,720 B2 | 7/2016 | Okamoto et al. |
| 2011/0101351 A1 | 5/2011 | Yamazaki |
| 2012/0293200 A1 | 11/2012 | Takemura |
| 2013/0147518 A1 | 6/2013 | Shionoiri et al. |
| 2013/0314124 A1 | 11/2013 | Ikeda et al. |
| 2013/0321025 A1 | 12/2013 | Kurokawa et al. |
| 2014/0159771 A1 | 6/2014 | Ikeda et al. |
| 2014/0176185 A1 | 6/2014 | Kurokawa |
| 2015/0008958 A1 | 1/2015 | Kurokawa |
| 2017/0141776 A1 | 5/2017 | Kozuma |

\* cited by examiner

FIG. 17A
(ST71) Step 71
(ST72) Step 72
(ST73) Step 73
(ST74) Step 74
(ST75) Step 75
(ST76) Step 76
(ST77) Step 77
(ST78) Step 78
(ST79) Step 79
FIG. 17B
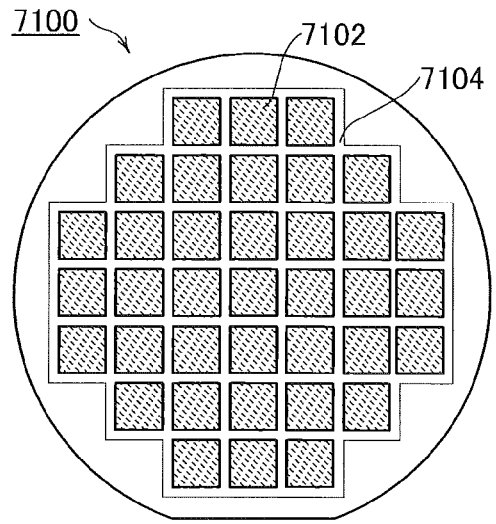
FIG. 17C
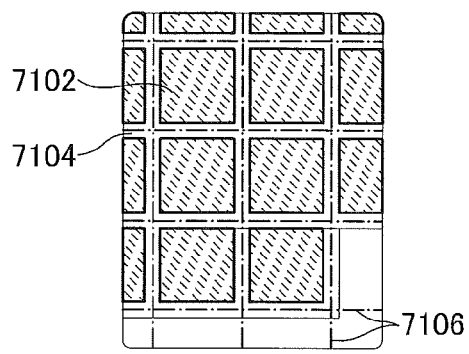
FIG. 17D
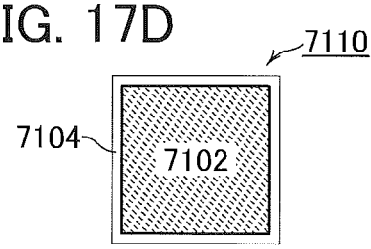
FIG. 17E
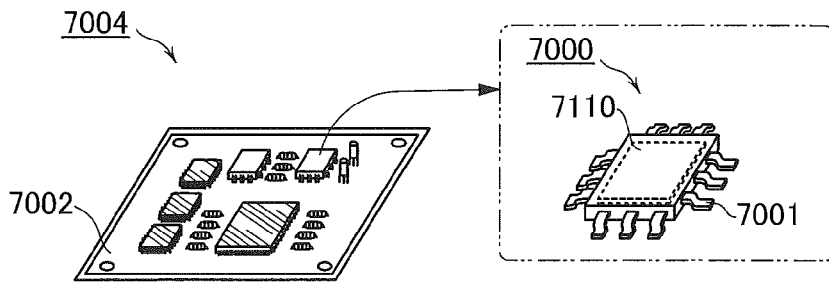

SEMICONDUCTOR DEVICE, ELECTRONIC COMPONENT, AND ELECTRONIC DEVICE

BACKGROUND OF THE INVENTION

1. Field of the Invention

One embodiment of the present invention relates to a semiconductor device, an electronic component, and an electronic device.

Note that one embodiment of the present invention is not limited to the above technical field. The technical field of the invention disclosed in this specification and the like relates to an object, a method, or a manufacturing method. Another embodiment of the present invention relates to a process, a machine, manufacture, or a composition of matter.

In this specification and the like, a semiconductor device generally means a device that can function by utilizing semiconductor characteristics. A display device (e.g., a liquid crystal display device or a light-emitting display device), a projection device, a lighting device, an electrooptic device, a power storage device, a memory device, a semiconductor circuit, an imaging device, an electronic device, or the like includes a semiconductor device in some cases.

2. Description of the Related Art

A programmable logic device (PLD) includes a plurality of programmable logic elements (PLE) and a plurality of programmable routing switches (PRS). In the PLD, data on the function of each PLE and data on connection between the PLEs by PRSs are stored as configuration data in a configuration memory. In other words, the circuit structure of the PLD is stored as configuration data.

A multi-context reconfigurable device has been suggested (e.g., Non-Patent Document 1). In the multi-context reconfigurable device, the circuit structure of a PLD is changed by storing a plurality of pieces of configuration data in the PLD and changing configuration data to be used. Configuration data representing a circuit structure is referred to as context. Furthermore, switching of the circuit structure of a PLD is referred to as context switch.

REFERENCE

Non-Patent Document

Non-Patent Document 1: H. M. Waidyasooriya et al., "Implementation of a Partially Reconfigurable Multi-Context FPGA Based on Asynchronous Architecture," IEICE TRANSACTIONS on Electronics, Vol. E92-C, pp. 539-549, 2009

SUMMARY OF THE INVENTION

Since one clock cycle with respect to time required for context switch becomes shorter as clock frequency becomes higher, context switch is not completed in one clock cycle. In that case, output data of a flip-flop included in a PLD is processed during the context switch, or with an incomplete circuit structure that is not a configuration data setting. As a result, data that is not intended by a user is generated, and data transfer between before and after the context switch cannot be performed correctly. Furthermore, in the case of an incomplete circuit in which a high-potential output signal and a low-potential output signal are supplied to the same node, shoot-through current might be generated, which leads to an increase in power consumption.

In addition, when circuit scale is increased, the load of a wiring for supplying a control signal (a context signal) for context switch is increased. Thus, context signal skew is generated. In other words, timing of context signal switch varies between circuits.

In addition, in the case where data of the flip-flop in the PLD is backed up in accordance with context signal switch, if time required for store operation (operation of storing data from the flip-flop to a backup circuit) is different from time required for load operation (operation of restoring the data from the backup circuit to the flip-flop), it might be difficult to equalize time required for context signal switch and time required for store and load operations.

An object of one embodiment of the present invention is to provide a semiconductor device in which data transfer between before and after context switch can be performed correctly even at high clock frequency. Another object of one embodiment of the present invention is to provide a semiconductor device in which generation of shoot-through current can be suppressed.

Another object of one embodiment of the present invention is to provide a semiconductor device that is capable of reducing parasitic capacitance by suppressing influence of skew on circuit operation and reducing layout area for a skew countermeasure circuit and wiring routing.

Another object of one embodiment of the present invention is to provide a semiconductor device that is capable of equalizing time required for context signal switch with time required for store and load operations in the case where data of a flip-flop in a PLD is backed up.

Note that the description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device that includes a context controller, a clock generation circuit, a programmable circuit, and a switch circuit. The programmable circuit includes a programmable logic element. The context controller has a function of detecting context switch and generating a switch signal in accordance with the context switch. The clock generation circuit has a function of generating a second clock signal whose frequency is lower than that of a first clock signal. The switch circuit has a function of supplying the first clock signal or the second clock signal to the programmable logic element in response to the switch signal.

One embodiment of the present invention is a semiconductor device that includes a context controller, a clock generation circuit, a programmable circuit, and a switch circuit. The programmable circuit includes a programmable logic element. The context controller includes a detection circuit, a signal generation circuit, and a determination circuit. The detection circuit has a function of detecting context switch. The signal generation circuit has a function of generating a context signal in accordance with the context switch. The determination circuit has a function of generating a switch signal in accordance with the context switch. The clock generation circuit has a function of generating a second clock signal whose frequency is lower than that of a first clock signal. The switch circuit has a function of supplying the first clock signal or the second clock signal to the programmable logic element in response to the switch signal.

One embodiment of the present invention is a semiconductor device that includes a context controller, a clock generation circuit, a programmable circuit, and a switch circuit. The programmable circuit includes a programmable logic element. The programmable logic element includes a flip-flop and a backup circuit that is capable of retaining data retained in the flip-flop. The context controller includes a detection circuit, a signal generation circuit, and a determination circuit. The detection circuit has a function of detecting context switch. The signal generation circuit has a function of generating a context signal in accordance with the context switch. The determination circuit has a function of generating a switch signal in accordance with the context switch. The clock generation circuit has a function of generating a second clock signal and a third clock signal each of which has frequency lower than a first clock signal. The clock generation circuit outputs the second clock signal in a period during which data is input from the flip-flop to the backup circuit and outputs the third clock signal in a period during which the data is input from the backup circuit to the flip-flop. The switch circuit has a function of supplying the first clock signal, the second clock signal, or the third clock signal to the programmable logic element in response to the switch signal.

In the semiconductor device in one embodiment of the present invention, the backup circuit preferably includes a first transistor and a second transistor. The first transistor preferably includes an oxide semiconductor in a semiconductor layer serving as a channel formation region. One of a source and a drain of the first transistor is preferably electrically connected to a gate of the second transistor. The first transistor is preferably capable of holding charge in the gate of the second transistor by turning off the first transistor.

Note that other embodiments of the present invention are disclosed in the following embodiments and the drawings.

According to one embodiment of the present invention, a semiconductor device in which data transfer between before and after context switch can be performed correctly even at high clock frequency can be provided. Alternatively, according to one embodiment of the present invention, a semiconductor device in which generation of shoot-through current can be suppressed can be provided.

Alternatively, according to one embodiment of the present invention, a semiconductor device that is capable of reducing parasitic capacitance by suppressing influence of skew on circuit operation and reducing layout area for a skew countermeasure circuit and wiring routing can be provided.

Alternatively, according to one embodiment of the present invention, a semiconductor device that is capable of equalizing time required for context signal switch with time required for store and load operations in the case where data of a flip-flop in a PLD is backed up can be provided.

Note that the description of these effects does not disturb the existence of other effects. One embodiment of the present invention does not necessarily achieve all the effects. Other effects will be apparent from and can be derived from the description of the specification, the drawings, the claims, and the like.

BRIEF DESCRIPTION OF THE DRAWINGS

In the accompanying drawings:
FIG. 17A is a flow chart showing an example of a method for manufacturing an electronic component,
and FIGS. 17B to 17E are schematic perspective views each illustrating a structure example of the electronic component.

DETAILED DESCRIPTION OF THE INVENTION

Figure 1:
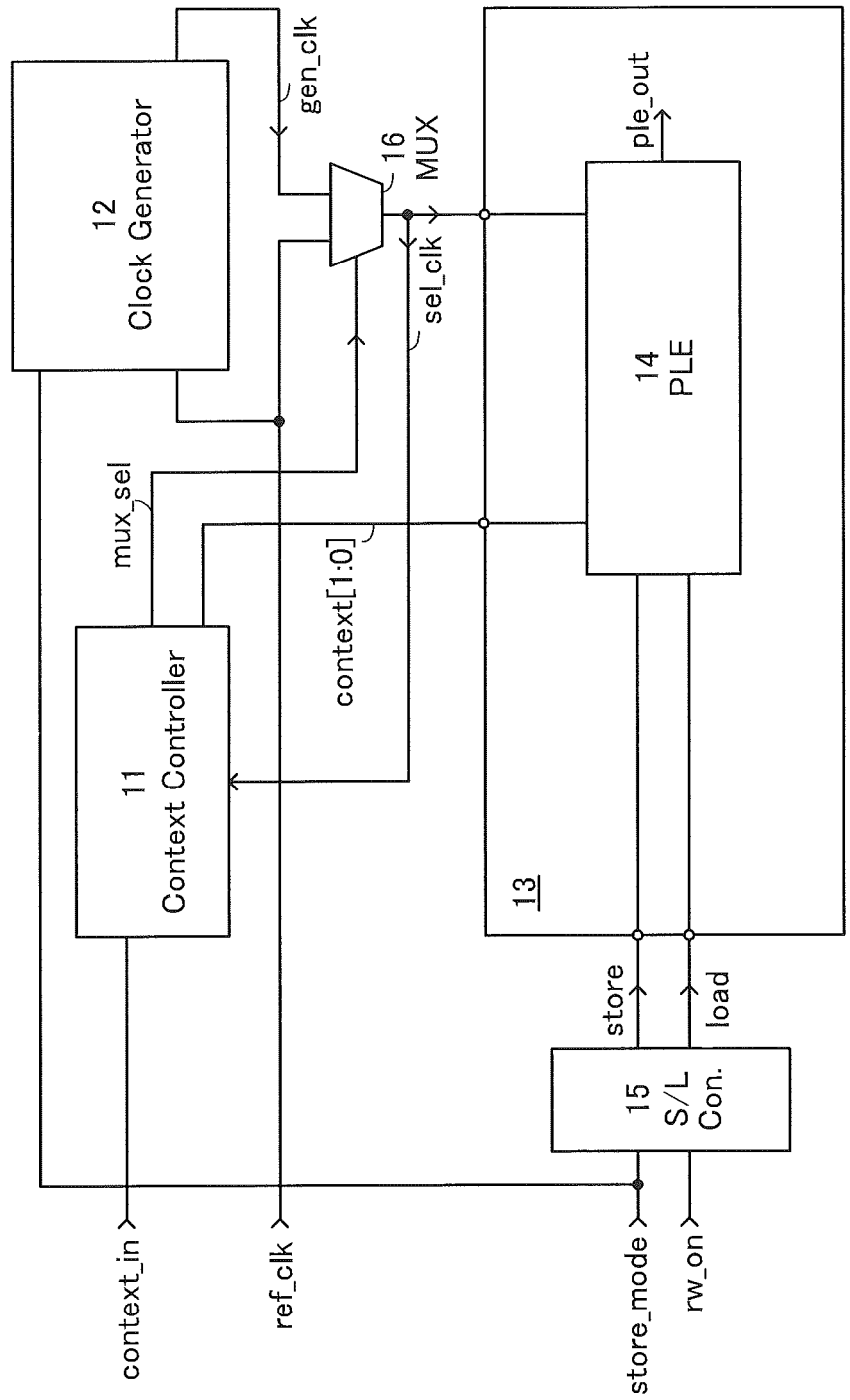
FIG. 1 is a block diagram illustrating a structure example of a semiconductor device.

Embodiments will be described below with reference to drawings. However, the embodiments can be implemented with various modes. It will be readily appreciated by those skilled in the art that modes and details can be changed in various ways without departing from the spirit and scope of the present invention. The present invention therefore should not be construed as being limited to the following description of the embodiments.

In this specification and the like, ordinal numbers such as "first," "second," and "third" are used in order to avoid confusion among components. Thus, the terms do not limit the number or order of components. For example, in this specification and the like, a "first" component in one embodiment can be referred to as a "second" component in other embodiments or claims. Alternatively, for example, in this specification and the like, a "first" component in one embodiment can be omitted in other embodiments or claims.

In the drawings, the same components, components having similar functions, components formed using the same material, or components formed at the same time are denoted by the same reference numerals, and the description thereof is not repeated in some cases.

Embodiment 1

The structure and operation of a semiconductor device in one embodiment of the present invention are described with reference to FIG. 1, FIG. 2, FIG. 3, FIG. 4, FIG. 5, FIG. 6, FIG. 7, FIG. 8, FIG. 9, FIGS. 10A and 10B, FIGS. 11A and 11B, FIG. 12, and FIG. 13. Note that the semiconductor device in one embodiment of the present invention functions as a multi-context programmable logic device.

<Structure of Semiconductor Device>

A semiconductor device 10 illustrated in a block diagram of FIG. 1 includes a context controller 11 (denoted by "Context Controller" in the diagram), a clock generation circuit 12 (denoted by "Clock Generator" in the diagram), and a programmable circuit 13. The semiconductor device 10 includes a store/load controller 15 (denoted by "S/L Con." in the diagram) and a switch circuit 16 (denoted by "MUX" in the diagram) as other components. The programmable circuit 13 includes a programmable logic element 14 (denoted by "PLE" in the diagram and hereinafter referred to as "PLE 14").

The context controller 11 has a function of detecting switch of a context control signal context_in and generating and outputting a context signal context[1:0] that is required for context switch in the programmable circuit 13. The context controller 11 also has a function of detecting switch of the context control signal context_in and generating and outputting a multiplexer control signal mux_sel for switching a signal output from the switch circuit 16 in a period during which the context of the programmable circuit 13 is switched.

The context control signal context_in is input to the context controller 11 from an external circuit. A selection clock signal sel_clk is input to the context controller 11 from the switch circuit 16. The context controller 11 outputs the multiplexer control signal mux_sel to the switch circuit 16. The context controller 11 outputs the context signal context[1:0] to the PLE 14.

The clock generation circuit 12 has a function of generating and outputting a generation clock signal gen_clk that is required to drive the context controller 11 and the programmable circuit 13. For example, in the case where the clock generation circuit 12 includes a ¼ frequency divider, the clock generation circuit 12 can generate a clock signal whose frequency is one quarter of that of a reference clock signal ref_clk as the generation clock signal gen_clk.

The clock generation circuit 12 is capable of switching the number of frequency divisions of the reference clock signal ref_clk in response to a mode switch signal store_mode. For example, in the case where the mode switch signal store_mode is set at a high level to store data of a flip-flop in the PLE 14, a clock signal with first frequency that is obtained by frequency division of the reference clock signal ref_clk is used as the generation clock signal gen_clk. Alternatively, in the case where the mode switch signal store_mode is set at a low level to load the data of the flip-flop in the PLE 14, a clock signal with second frequency that is obtained by frequency division of the reference clock signal ref_clk is used as the generation clock signal gen_clk.

The mode switch signal store_mode is input to the clock generation circuit 12 from the external circuit. The reference clock signal ref_clk is input to the clock generation circuit 12 from the external circuit. The clock generation circuit 12 outputs the generation clock signal gen_clk to the switch circuit 16.

The programmable circuit 13 includes a programmable routing switch (PRS), a programmable input/output (PIO), and the like in addition to the PLE 14 whose circuit structure can be changed in accordance with data of a configuration memory. For example, a circuit state config_state of the programmable circuit 13 is Circuit[0] when the potential of a context signal context[0] is high, and the circuit state config_state of the programmable circuit 13 is Circuit[1] when the potential of a context signal context[1] is high.

The PLE 14 includes a configuration memory, a look-up table, and a flip-flop with a backup function. Configuration data is stored in the configuration memory. The function of the look-up table can be changed depending on configuration data in the configuration memory. The flip-flop with a backup function includes a flip-flop and a backup circuit. Data in the flip-flop is transferred in response to the selection clock signal sel_clk. The data in the flip-flop is stored in the backup circuit in response to a backup data write signal store. The data in the backup circuit is restored to the flip-flop in response to a backup data read signal load.

The backup data write signal store is input to the PLE 14 from the store/load controller 15. The backup data read signal load is input to the PLE 14 from the store/load controller 15. The selection clock signal sel_clk is input to the PLE 14 from the switch circuit 16. The PLE 14 outputs an output signal ple_out to the other circuits in the programmable circuit 13.

The store/load controller 15 has a function of outputting the backup data write signal store and the backup data read signal load in response to the mode switch signal store_mode and a write/read control signal rw_on. In addition, the store/load controller 15 has a function of, for example, setting the potential of the backup data write signal store at a high level when the potential of the mode switch signal store_mode is at a high level and the potential of the write/read control signal rw_on is at a high level. Furthermore, the store/load controller 15 has a function of, for example, setting the potential of the backup data read signal load at a high level when the potential of the mode switch signal store_mode is at a low level and the potential of the write/read control signal rw_on is at a high level.

The mode switch signal store_mode and the write/read control signal rw_on are input to the store/load controller 15 from the external circuit. The store/load controller 15 outputs the backup data write signal store and the backup data read signal load to the PLE 14.

The switch circuit 16 has a function of outputting the reference clock signal ref_clk or the generation clock signal gen_clk in response to the multiplexer control signal mux_sel.

The multiplexer control signal mux_sel is input to the switch circuit 16 from the context controller 11. The reference clock signal ref_clk is input to the switch circuit 16 from the external circuit. The generation clock signal gen_clk is input to the switch circuit 16 from the clock generation circuit 12. The switch circuit 16 outputs the selection clock signal sel_clk to each circuit in the programmable circuit 13 and the context controller 11.

With the structure in FIG. 1, it is possible to switch the frequency of the selection clock signal sel_clk output to the PLE 14 to low frequency in context switch. Thus, time required for the context switch can be secured. With a structure where the frequency of the selection clock signal sel_clk is returned to the original frequency of the reference clock signal ref_clk in a period during which the context switch is not performed, it is possible to obtain an FPGA that can maintain high-speed processing and can perform the context switch accurately and safely. The time required for the context switch mainly depends on a hardware structure (circuit layout including a parasitic component). Thus, the reliability in the context switch can be improved when time that is equal to or longer than the longest time required for circuit change is secured.

With the structure in FIG. 1, the frequency of the selection clock signal sel_clk can be lowered in the context switch to extend one clock cycle; thus, context switch operation can be completed in one clock cycle. In that case, output data of the flip-flop included in the PLE 14 can be processed reliably during the context switch without an incomplete circuit structure that is not a configuration data setting. As a result, data that is not intended by a user is not generated, and data transfer between before and after the context switch can be performed correctly. Furthermore, an incomplete circuit in which a high-potential output signal and a low-potential output signal are supplied to the same node is not generated; thus, shoot-through is not generated, which leads to a reduction in power consumption.

In addition, with the structure in FIG. 1, the frequency of the selection clock signal sel_clk can be lowered in the context switch to extend one clock cycle; thus, skew of the context signal is less unlikely to influence circuit operation. Thus, parasitic capacitance can be reduced by reducing layout area for a skew countermeasure circuit that is needed for high-speed operation and wiring routing. Consequently, the power consumption can be reduced.

Note that although FIG. 1 illustrates the case where data of the flip-flop included in the PLE 14 is stored or loaded, the clock generation circuit 12 in one embodiment of the present invention is effective even in context switch operation without store/load operation. In that case, the clock generation circuit 12 can achieve stable context switch by switching the frequency of the selection clock signal sel_clk to frequency suitable for time required for context switch by the programmable circuit 13.

<Structure of Context Controller>

Figure 2:
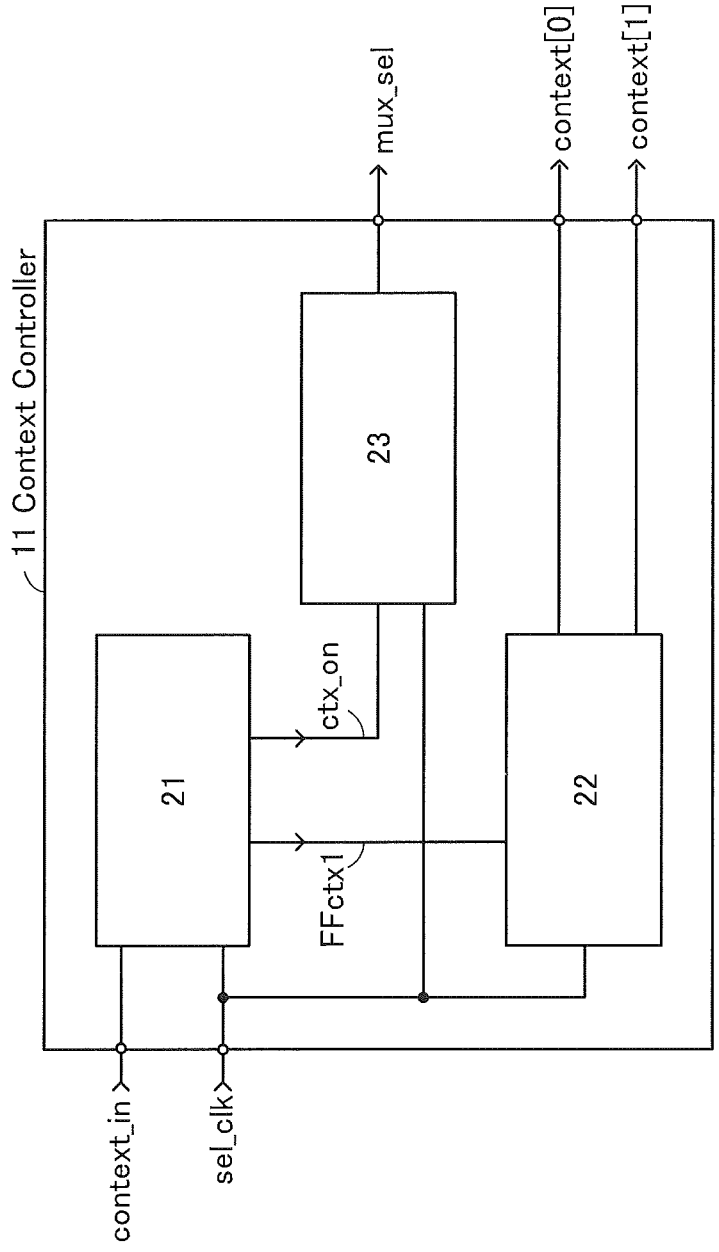
FIG. 2 is a block diagram illustrating a structure example of a semiconductor device.

The context controller 11 illustrated in a block diagram of FIG. 2 includes a detection circuit 21, a signal generation circuit 22, and a determination circuit 23.

The detection circuit 21 detects logic transition of the context control signal context_in. The detection circuit 21 has a function of generating a pulse signal FFctx1 and a pulse signal ctx_on that synchronize the selection clock signal sel_clk when the detection circuit 21 detects the logic transition. The logic transition means, for example, switching of the potential of a signal to a high level to a low level or switching of the potential of a signal to a low level to a high level.

The context control signal context_in is input to the detection circuit 21 from the external circuit. The selection clock signal sel_clk is input to the detection circuit 21 from the switch circuit 16. The detection circuit 21 outputs the pulse signal FFctx1 to the signal generation circuit 22. In addition, the detection circuit 21 outputs the pulse signal ctx_on to the determination circuit 23.

The signal generation circuit 22 has a function of generating a context signal context on the basis of the pulse signal FFctx1 and the selection clock signal sel_clk. In the following description, a context signal is a 2-bit signal and is referred to as context[1:0] in some cases. This means a combination of the context signal context[0] and the context signal context[1].

The pulse signal FFctx1 is input to the signal generation circuit 22 from the detection circuit 21. The selection clock signal sel_clk is input to the signal generation circuit 22 from the switch circuit 16. The signal generation circuit 22 outputs the context signal context[0] and the context signal context[1] to the PLE 14.

The determination circuit 23 has a function of activating the logic of the multiplexer control signal mux_sel when logic transition of the context control signal context_in is detected by the detection circuit 21. In addition, the determination circuit 23 has a function of deactivating the logic of the multiplexer control signal mux_sel by automatic reset of the determination circuit 23 after a lapse of a certain period (context switch time) determined in the determination circuit 23.

The selection clock signal sel_clk is input to the determination circuit 23 from the switch circuit 16. The pulse signal ctx_on is input to the determination circuit 23 from the detection circuit 21. The determination circuit 23 outputs the multiplexer control signal mux_sel to the switch circuit 16.

Figure 3:
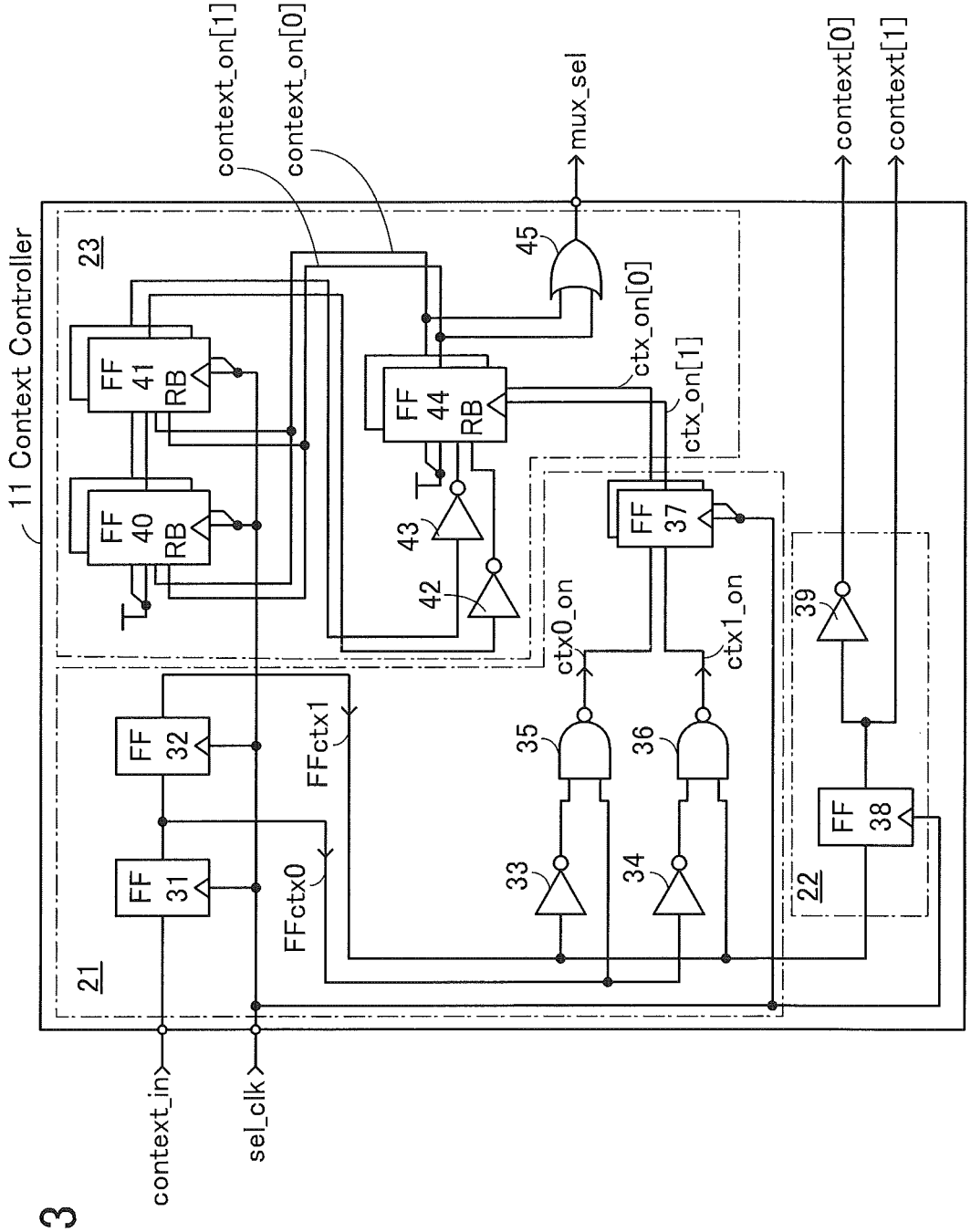
FIG. 3 is a circuit diagram illustrating a structure example of a semiconductor device.

A circuit diagram in FIG. 3 illustrates an example of a specific circuit structure of the context controller 11 in FIG. 2.

The context controller 11 includes a flip-flop 31 (denoted by "FF" in the diagram), a flip-flop 32, an inverter circuit 33, an inverter circuit 34, a NAND circuit 35, a NAND circuit 36, a flip-flop 37, a flip-flop 38, an inverter circuit 39, a flip-flop 40, a flip-flop 41, an inverter circuit 42, an inverter circuit 43, a flip-flop 44, and an OR circuit 45. Each of the flip-flop 37, the flip-flop 40, the flip-flop 41, and the flip-flop 44 includes two flip-flops (for example, the flip-flop 37 includes a flip-flop 37[0] and a flip-flop 37[1]) to retain 2-bit data.

The context control signal context_in is input to a data input terminal of the flip-flop 31. The selection clock signal sel_clk is input to a clock input terminal of the flip-flop 31. An output signal of the flip-flop 31 is input to a data input terminal of the flip-flop 32. The output signal of the flip-flop 31 is output to an input terminal of the NAND circuit 35 and an input terminal of the inverter circuit 34. The output signal of the flip-flop 31 is a pulse signal FFctx0.

The selection clock signal sel_clk is input to a clock input terminal of the flip-flop 32. An output signal of the flip-flop 32 is output to a data input terminal of the flip-flop 38, an input terminal of the NAND circuit 36, and an input terminal of the inverter circuit 33. The output signal of the flip-flop 32 is the pulse signal FFctx1.

An output signal of the inverter circuit 33 is output to the input terminal of the NAND circuit 35.

An output signal of the NAND circuit 35 is output to a data input terminal of the flip-flop 37[0]. The output signal of the NAND circuit 35 is a pulse signal ctx0_on.

An output signal of the inverter circuit 34 is output to the input terminal of the NAND circuit 36.

An output signal of the NAND circuit 36 is output to a data input terminal of the flip-flop 37[1]. The output signal of the NAND circuit 36 is a pulse signal ctx1_on.

The selection clock signal sel_clk is input to a clock input terminal of the flip-flop 37[0]. An output signal of the flip-flop 37[0] is input to a clock input terminal of a flip-flop 44[0]. The output signal of the flip-flop 37[0] is a pulse signal ctx_on[0].

The selection clock signal sel_clk is input to a clock input terminal of the flip-flop 37[1]. An output signal of the flip-flop 37[1] is input to a clock input terminal of a flip-flop 44[1]. The output signal of the flip-flop 37[1] is a pulse signal ctx_on[0].

The selection clock signal sel_clk is input to a clock input terminal of the flip-flop 38. An output signal of the flip-flop 38 is output to an input terminal of the inverter circuit 39. The output signal of the flip-flop 38 is the context signal context[1]. An output signal of the inverter circuit 39 is the context signal context[0].

A high-level potential is input to a data input terminal of the flip-flop 44[0]. An output signal of the inverter circuit 42 is input to an inversion reset terminal of the flip-flop 44[0]. An output signal of the flip-flop 44[0] is output to inversion reset terminals of a flip-flop 40 [0] and a flip-flop 41[0] and an input terminal of the OR circuit 45. The output signal of the flip-flop 44[0] is a pulse signal context_on[0]. Note that the pulse signal context_on[0] is also referred to as a context switch state signal context_on[0].

A high-level potential is input to a data input terminal of the flip-flop 44[1]. An output signal of the inverter circuit 43 is input to an inversion reset terminal of the flip-flop 44[1]. An output signal of the flip-flop 44[1] is output to inversion reset terminals of a flip-flop 40[1] and a flip-flop 41[1] and the input terminal of the OR circuit 45. The output signal of the flip-flop 44[1] is a pulse signal context_on[1]. Note that the pulse signal context_on[1] is also referred to as a context switch state signal context_on[1].

The selection clock signal sel_clk is input to a clock input terminal of the flip-flop 40[0]. A high-level potential is input to a data input terminal of the flip-flop 40[0]. An output signal of the flip-flop 40[0] is input to a data input terminal of the flip-flop 41[0].

The selection clock signal sel_clk is input to a clock input terminal of the flip-flop 40[1]. A high-level potential is input to a data input terminal of the flip-flop 40[1]. An output signal of the flip-flop 40[1] is input to a data input terminal of the flip-flop 41[1].

The selection clock signal sel_clk is input to a clock input terminal of the flip-flop 41[0]. An output signal of the flip-flop 41[0] is output to an input terminal of the inverter circuit 42.

The selection clock signal sel_clk is input to a clock input terminal of the flip-flop 41[1]. An output signal of the flip-flop 41[1] is output to an input terminal of the inverter circuit 43.

An output signal of the OR circuit 45 is the multiplexer control signal mux_sel.

With the structures in FIG. 2 and FIG. 3, the context controller 11 can detect switch of the context control signal context_in and can generate and output the context signal context[1:0] that is required for context switch in the programmable circuit 13. In addition, the context controller 11 can detect switch of the context control signal context_in and can generate and output the multiplexer control signal mux_sel for switching a signal output from the switch circuit 16 in a period during which the context of the programmable circuit 13 is switched.

<Structure of Clock Generation Circuit>

Figure 4:
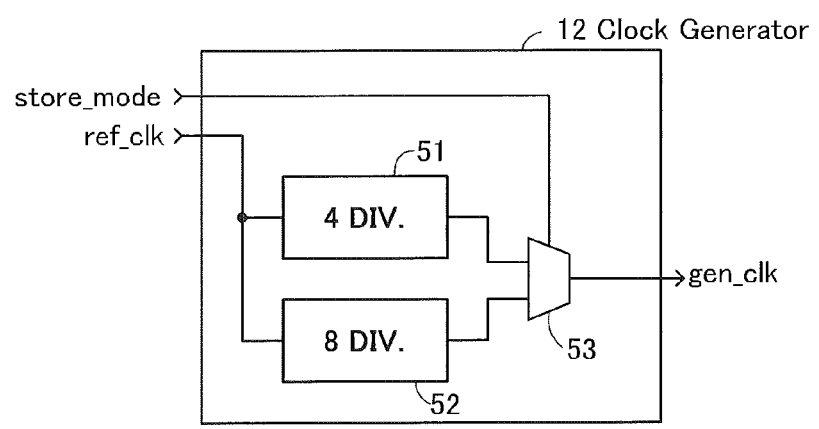
FIG. 4 is a circuit diagram illustrating a structure example of a semiconductor device.

The clock generation circuit 12 illustrated in a circuit diagram in FIG. 4 includes a frequency divider 51, a frequency divider 52, and a switch circuit 53.

The frequency divider 51 (denoted by "4 DIV." in the diagram) and the frequency divider 52 (denoted by "8 DIV" in the diagram) are circuits that switch the number of frequency divisions of the reference clock signal ref_clk. The frequency divider 51 and the frequency divider 52 preferably have different frequency division numbers. For example, the frequency divider 51 outputs a clock signal whose frequency is one quarter of that of the reference clock signal ref_clk, and the frequency divider 52 outputs a clock signal whose frequency is one eighth of that of the reference clock signal ref_clk. Clock signals generated in the frequency divider 51 and the frequency divider 52 are output to input terminals of the switch circuit 53.

The switch circuit 53 switches and outputs a clock signal generated in the frequency divider 51 or a clock signal generated in the frequency divider 52 in response to the mode switch signal store_mode. An output signal of the switch circuit 53 is the generation clock signal gen_clk.

The clock generation circuit 12 with the structure in FIG. 4 is capable of switching the number of frequency divisions of the reference clock signal ref_clk in response to the mode switch signal store_mode. When two frequency dividers (the frequency divider 51 and the frequency divider 52) are included, the frequency of a clock signal can be switched depending on operation, for example, a clock signal whose frequency is one eighth of that of the reference clock signal ref_clk is used as the generation clock signal gen_clk when data in the flip-flop in the PLE 14 is stored or a clock signal whose frequency is one quarter of that of the reference clock signal ref_clk is used as the generation clock signal gen_clk when data in the flip-flop in the PLE 14 is loaded.

Note that in the case where the speed of the reference clock signal ref_clk is lower than the speed of store or load operation, it is not necessary to lower the frequency of the generation clock signal gen_clk output from the clock generation circuit 12 when data in the flip-flop in the PLE 14 is stored or loaded. In that case, the reference clock signal ref_clk may be directly used as the generation clock signal gen_clk in context switch. With such a structure, the semiconductor device can be driven without an unnecessary reduction in operation speed.

<Structure of Programmable Logic Element>

Figure 5:
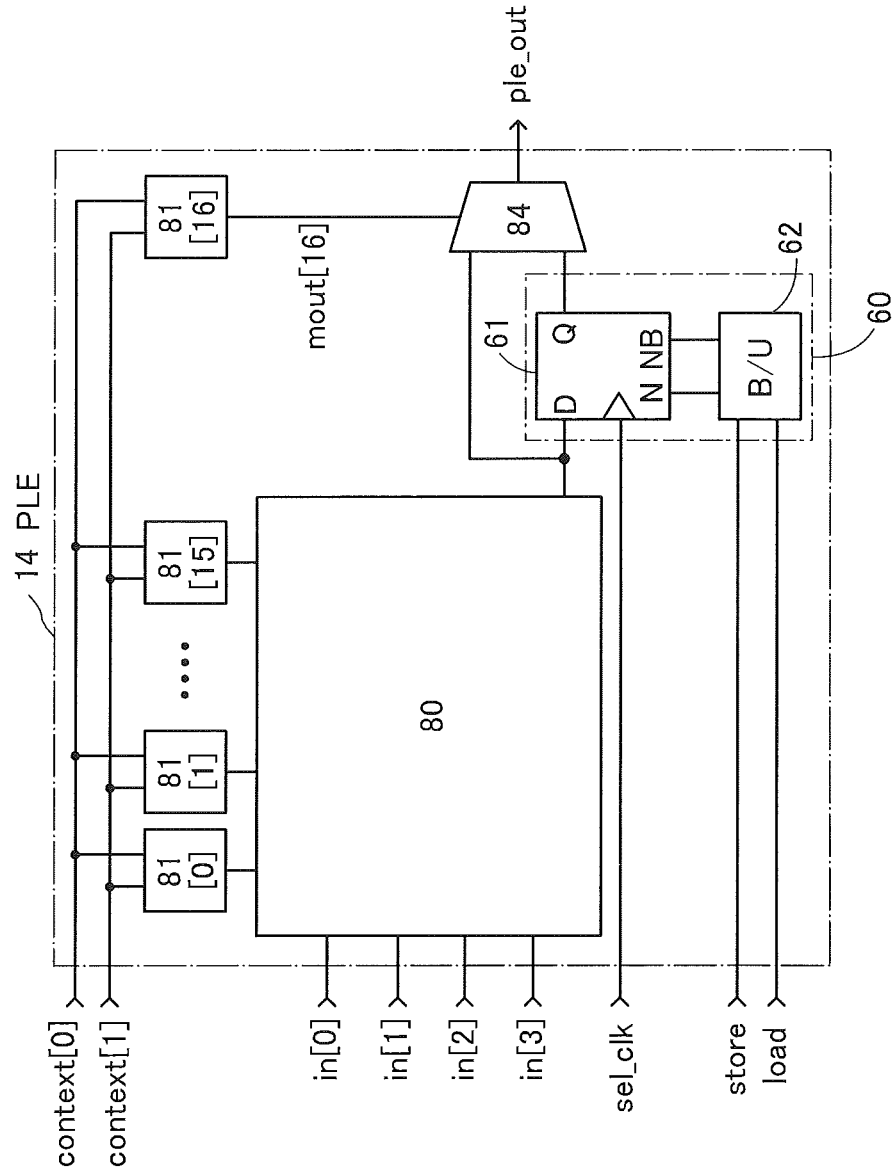
FIG. 5 is a circuit diagram illustrating a structure example of a semiconductor device.

The PLE 14 illustrated in a circuit diagram of FIG. 5 includes, for example, a look-up table 80, a multiplexer 84, configuration memories 81[0] to 81[16], and a flip-flop 60 with a backup function. The flip-flop 60 with a backup function includes a flip-flop 61 and a backup circuit 62.

Signals in[0] to in[3] are input to the look-up table 80 from another PLE 14 or the like. An output signal of the look-up table 80 is output to a data input terminal of the flip-flop 61 and a first input terminal of the multiplexer 84.

Although the look-up table 80 is a 4-input look-up table, one embodiment of the present invention is not limited thereto. For example, the look-up table 80 may be a 6-input look-up table or a p-input look-up table (p is an integer of 2 or more).

The signals context[0] and context[1] are input to the configuration memories 81[0] to 81[16] from the context controller 11. Output signals of the configuration memories 81[0] to 81[15] are output to the look-up table 80. An output signal of the configuration memory 81[16] is output to a selection signal input terminal of the multiplexer 84.

The flip-flop 60 with a backup function has a function of performing either retention or output to a second input terminal of the multiplexer 84, of an output signal of the look-up table 80 depending on the logic of the selection clock signal sel_clk. The multiplexer 84 has a function of outputting, as the output signal ple_out, a signal with a logic that corresponds to the logic of one of a signal output from the look-up table 80 and a signal output from a data output terminal of the flip-flop 60 in accordance with the logic of a signal output from the configuration memory 81[16].

An output signal of the flip-flop 61 is output to the first input terminal of the multiplexer 84. The selection clock signal sel_clk is input to a clock input terminal of the flip-flop 61 from the switch circuit 16. An output signal of the multiplexer 84 is the output signal ple_out.

The backup data write signal store and the backup data read signal load are input to the backup circuit 62 from the store/load controller 15. An output signal and an inverted output signal of the flip-flop 61 are input to the backup circuit 62 in response to the backup data write signal store. An output signal of the backup circuit 62 is output to an output terminal and an inverted output terminal of the flip-flop 61 in response to the backup data read signal load.

Figure 6:
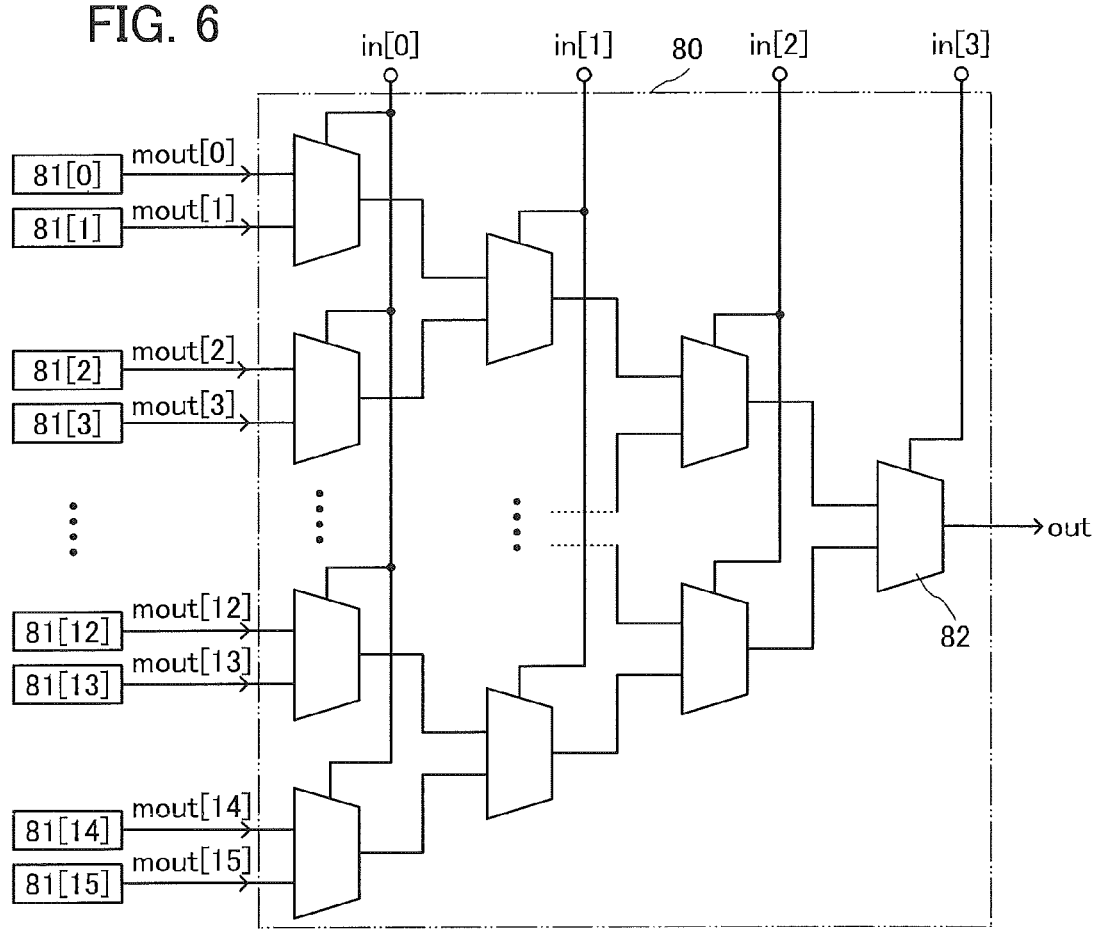
FIG. 6 is a circuit diagram illustrating a structure example of a semiconductor device.

The look-up table 80 includes a plurality of switch circuits 82 and outputs an output signal of one of the configuration memories 81[0] to 81[15] in accordance with the logic of the signals in[0] to in[3], as illustrated in FIG. 6. The configuration memories 81[0] to 81[16] each retain configuration data and output a signal corresponding to the retained configuration data.

Figure 7:
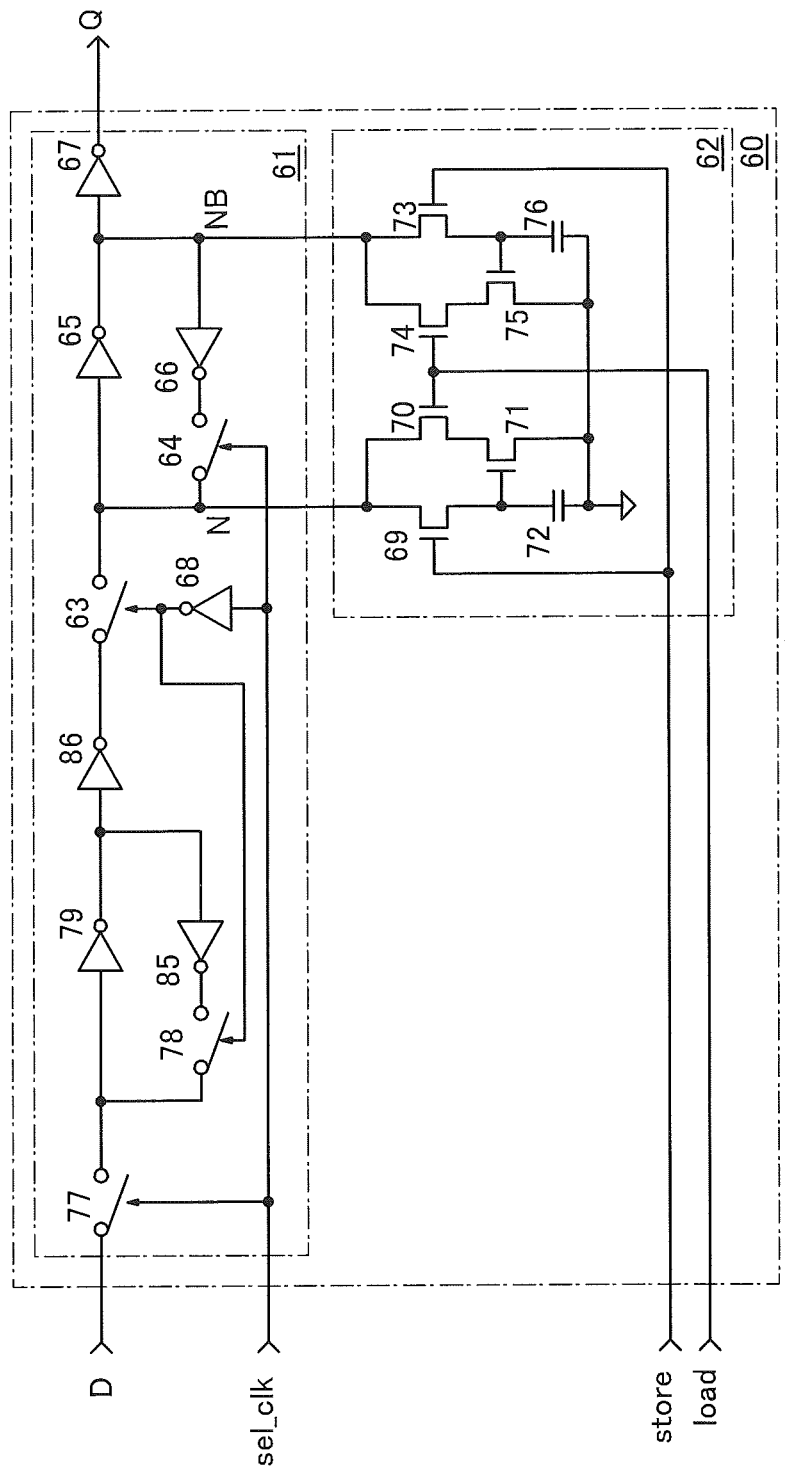
FIG. 7 is a circuit diagram illustrating a structure example of a semiconductor device.

FIG. 7 illustrates a structure example of the flip-flop 60 with a backup function included in the PLE 14.

The flip-flop 60 with a backup function includes the flip-flop 61 and the backup circuit 62. The flip-flop 61 includes a switch 63, a switch 64, an inverter circuit 65, an inverter circuit 66, an inverter circuit 67, an inverter circuit 68, a switch 77, a switch 78, an inverter circuit 79, an inverter circuit 85, and an inverter circuit 86. The backup circuit 62 includes a transistor 69, a transistor 70, a transistor 71, a capacitor 72, a transistor 73, a transistor 74, a transistor 75, and a capacitor 76.

The on/off state of each of the switch 63, the switch 64, the switch 77, and the switch 78 is controlled by the selection clock signal sel_clk. Here, each of the switch 63, the switch 64, the switch 77, and the switch 78 is turned on when the selection clock signal sel_clk is at a high level, and each of the switch 63, the switch 64, the switch 77, and the switch 78 is turned off when the selection clock signal sel_clk is at a low level.

The flip-flop 61 takes data D when the selection clock signal sel_clk is set at a high level and then is set at a low level. The flip-flop 61 continues to retain the taken data D as an output signal Q by maintaining the on-state of the switch 64.

A wiring to which the backup data write signal store is input and a gate terminal of the transistor 73 are connected to a gate terminal of the transistor 69. A node N in the flip-flop 61 is connected to one of a source terminal and a drain terminal of the transistor 69. A gate terminal of the transistor 71 and one terminal of the capacitor 72 are connected to the other of the source terminal and the drain terminal of the transistor 69.

A wiring to which the backup data read signal load is input and a gate terminal of the transistor 74 are connected to a gate terminal of the transistor 70. The node N in the flip-flop 61 is connected to one of a source terminal and a drain terminal of the transistor 70. One of a source terminal and a drain terminal of the transistor 71 is connected to the other of the source terminal and the drain terminal of the transistor 70.

A ground potential is applied to the other of the source terminal and the drain terminal of the transistor 71.

The ground potential is applied to the other terminal of the capacitor 72.

The wiring to which the backup data write signal store is input and the gate terminal of the transistor 69 are connected to the gate terminal of the transistor 73. A node NB in the flip-flop 61 is connected to one of a source terminal and a drain terminal of the transistor 73. A gate terminal of the transistor 75 and one terminal of the capacitor 76 are connected to the other of the source terminal and the drain terminal of the transistor 73.

The wiring to which the backup data read signal load is input and the gate terminal of the transistor 70 are connected to the gate terminal of the transistor 74. The node NB in the flip-flop 61 is connected to one of a source terminal and a drain terminal of the transistor 74. One of a source terminal and a drain terminal of the transistor 75 is connected to the other of the source terminal and the drain terminal of the transistor 74.

The ground potential is applied to the other of the source terminal and the drain terminal of the transistor 75.

The ground potential is applied to the other terminal of the capacitor 76.

Each of the transistors 69 and 74 has extremely low leakage current in an off-state (off-state current). A transistor whose channel formation region includes an oxide semiconductor layer (an OS transistor) is preferably used as such a transistor. When an OS transistor is used as each of the transistors 69 and 74, it is possible to retain charge based on the potential of data retained in the capacitors 72 and 76 by maintaining the off-state of each of the transistors 69 and 74.

The PLE 14 with the structures in FIG. 5, FIG. 6, and FIG. 7 can have a function of retaining data input in synchronization with the selection clock signal sel_clk in the flip-flop 61. In addition, the PLE 14 can retain data retained in the flip-flop when the backup data write signal store is set in an active state in the backup circuit 62. Furthermore, the PLE 14 can write data retained in the backup circuit 62 to a retention node of the flip-flop 61 when the backup data read signal load is set in an active state.

Although FIG. 5 and FIG. 7 each illustrate a structure where one backup circuit 62 included in the flip-flop 60 with a backup function is provided for one flip-flop 61, one embodiment of the present invention is not limited to this structure. For example, the flip-flop 60 with a backup function may include a plurality of backup circuits 62 for one flip-flop 61. In the case where two or more backup circuits 62 are included, data is written to the plurality of backup circuits 62 from the node N in the flip-flop 61, and it takes time compared to the case where data is written to one backup circuit 62. Therefore, it is possible to flexibly control the flip-flop 60 with a backup function that includes a plurality of backup circuits 62 when clock frequency can be changed in the clock generation circuit 12 depending on the number of backup circuits 62 to which data of the flip-flop 61 is written.

<Operation of Semiconductor Device>

Figure 8:
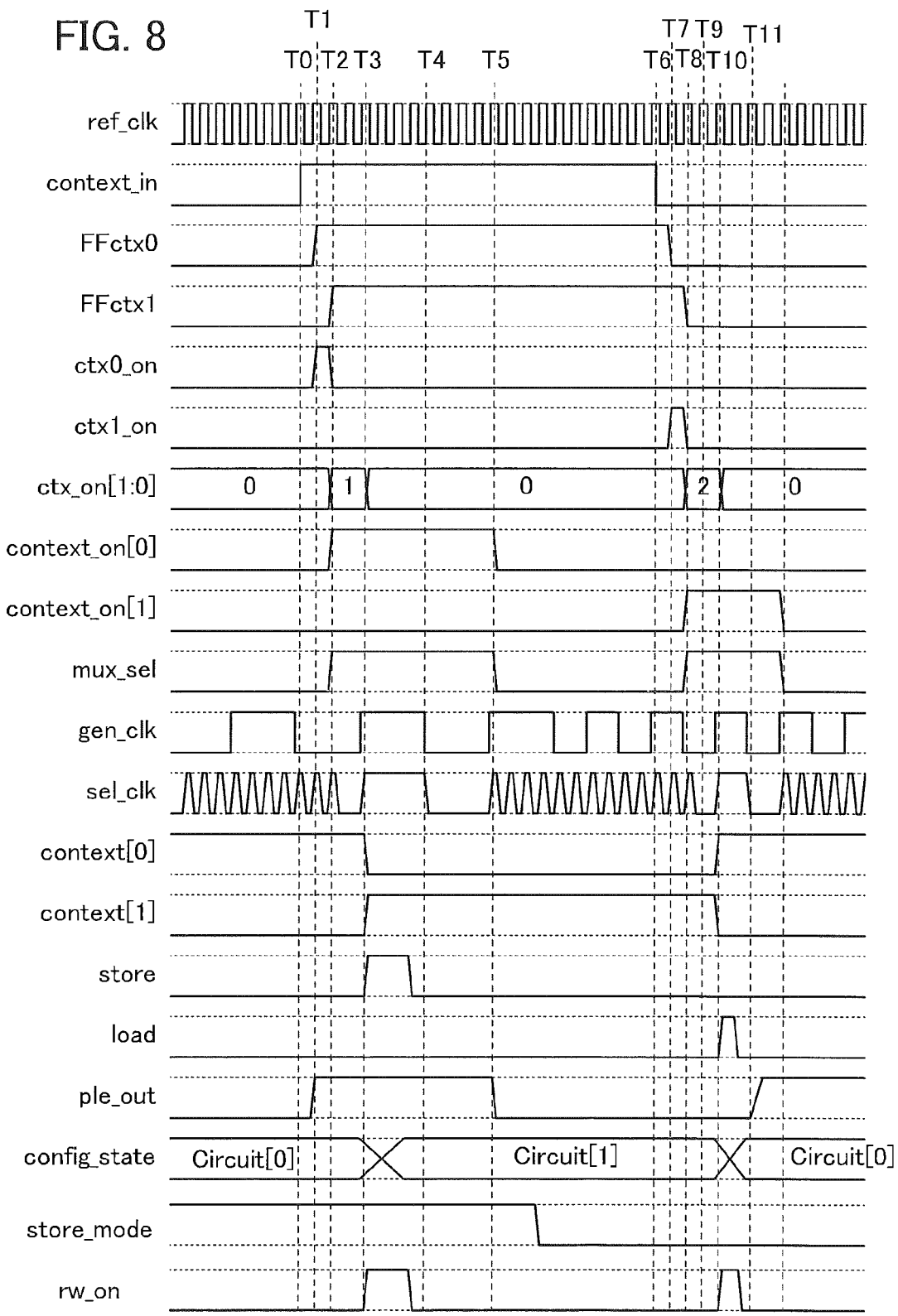
FIG. 8 is a timing chart illustrating an operation example of a semiconductor device.

FIG. 8 is an example of a timing chart illustrating operation when the semiconductor device in FIG. 1 is formed using the circuits in FIG. 3, FIG. 4, FIG. 5, and FIG. 6.

FIG. 8 illustrates the reference clock signal ref_clk, the context control signal context_in, the pulse signal FFctx0, the pulse signal FFctx1, the pulse signal ctx0_on, the pulse signal ctx1_on, a 2-bit pulse signal ctx_on[1:0], the context switch state signal context_on[0], the context switch state signal context_on[1], the multiplexer control signal mux_sel, the context signal context[0], the context signal context[1], the selection clock signal sel_clk, the generation clock signal gem clk, the backup data write signal store, the backup data read signal load, the output signal ple_out, the circuit state config_state of the programmable circuit 13, the mode switch signal store_mode, and the write/read control signal rw_on.

In an initial state, the context signal context[0] is selected; thus, the context signal context[0] is high, the circuit state config_state is Circuit[0], and all the other signals are low.

In the description of FIG. 8, the flip-flop takes data in synchronization with the rising edge of the selection clock signal sel_clk.

At time T0, the context control signal context_in is set at a high level. The context control signal context_in is input as an asynchronous signal. The context control signal context_in is input to the flip-flop; thus, the context control signal context_in is input in synchronization with the selection clock signal sel_clk. Note that each of the context switch state signal context_on[0] and the context switch state signal context_on[1] is at a low level; thus, the multiplexer control signal mux_sel is set at a low level and the reference clock signal ref_clk is selected as the selection clock signal sel_clk and is output from the switch circuit 16.

At time T1, when the selection clock signal sel_clk is set at a high level, the pulse signal FFctx0 is set at a high level because the context control signal context_in is at a high level. Since the pulse signal FFctx0 is at a high level and the pulse signal FFctx1 is at a low level, the pulse signal ctx0_on is set at a high level.

At time T2, when the selection clock signal sel_clk is set at a high level, the pulse signal FFctx1 is set at a high level because the pulse signal FFctx0 is at a high level. Since the pulse signal FFctx0 maintains at a high level and the pulse signal FFctx1 is at a high level, the pulse signal ctx0_on is set at a low level.

Since the pulse signal ctx0_on is at a low level, the pulse signal ctx_on[0] is set at a high level. When the pulse signal cbc_on[0] is set at a high level, the context switch state signal context_on[0] is set at a high level. When the context switch state signal context_on[0] is set at a high level, the multiplexer control signal mux_sel is set at a high level; thus, the generation clock signal gen_clk generated in the clock generation circuit 12 is selected and output as the selection clock signal sel_clk. Note that the mode switch signal store_mode is at a high level, and the generation clock signal gen_clk generated in the clock generation circuit 12 is a clock signal whose frequency is one eighth of that of the reference clock signal ref_clk.

At time T3, when the selection clock signal sel_clk is set at a high level, the context signal context[1] is set at a high level because the pulse signal FFctx1 is at a high level. When the context signal context[1] is set at a high level, the context signal context[0] is set at a low level because the context signal context[0] is an inverted signal of the context signal context[1]. Transition of the circuit state config_state to Circuit[1] is started because the context signal context[0] is at a low level and the context signal context[1] is at a high level. Since the pulse signal ctx0_on is at a low level, the pulse signal ctx_on[0] is set at a low level.

When the write/read control signal rw_on is set at a high level while the mode switch signal store_mode is at a high level, the backup data write signal store is set at a high level. At this time, the output signal ple_out is at a high level; thus, the high-level potential of the output signal of the flip-flop 61 is written to and retained in the backup circuit 62. Note that in store operation, the high-level potential is written to the capacitor 72 or the capacitor 76 through the OS transistor; thus, it takes time to write the high-level potential. Therefore, a clock signal with a cycle longer than or equal to time required for the store operation (here, a clock signal whose frequency is one eighth of that of the reference clock signal ref_clk) is supplied from the clock generation circuit 12.

At time T4, transition of the circuit state config_state to Circuit[1] is completed. In the case where the operation continues by switching from the high-speed clock signal (the reference clock signal ref_clk) to the low-speed clock signal (the clock signal whose frequency is one eighth of that of the reference clock signal ref_clk), it is possible to obtain a structure where data processing is not performed during transition of the circuit state config_state, that is, data processing is not performed during circuit structure change by context switch and during store operation from the flip-flop 61 to the backup circuit 62.

At time T5, when the selection clock signal sel_clk is set at a high level, the flip-flop that outputs the context switch state signal context_on[0] is reset and the context switch state signal context_on[0] is set at a low level. When the context switch state signal context_on[0] is set at a low level, the multiplexer control signal mux_sel is set at a low level; thus, the reference clock signal ref_clk is selected and output as the selection clock signal sel_clk.

At and after time T6, operations similar to the operations from time T0 to time T5 are performed. Note that the logic differs due to the difference in the logic of the context control signal context_in. Although the logic of the pulse signal ctx0_on is not changed, the logic of the pulse signal ctx1_on is changed. The logics of the pulse signal ctx_on[1], the context switch state signal context_on[1], the multiplexer control signal mux_sel, and the context signal context[1:0] are changed in accordance with the change in the pulse signal ctx1_on.

Note that at time T11, when the mode switch signal store_mode is set at a low level, the write/read control signal rw_on is set at a high level, and the backup data read signal load is set in an active state, the high-level potential of the backup circuit 62 is written to a data retention node of the flip-flop 61 because the output signal ple_out is at a low level, and the output signal ple_out is set at a high level. In the structure of FIG. 7, the load operation corresponds to operation of lowering the potential of the data retention node of the flip-flop 61 to a low-level potential through the n-channel transistors 74 and 75; thus, the load operation is completed faster than the store operation. Therefore, a clock signal with a cycle longer than or equal to time required for the load operation and frequency higher than that of the store operation (here, a clock signal whose frequency is one quarter of that of the reference clock signal ref_clk) is supplied from the clock generation circuit 12.

As described above, in the operation of the semiconductor device, the frequency of the selection clock signal sel_clk can be lowered in the context switch to extend one clock cycle; thus, context switch operation can be completed in one clock cycle. In that case, output data of the flip-flop included in the PLE 14 can be processed reliably during the context switch without an incomplete circuit structure that is not a configuration data setting. As a result, data that is not intended by a user is not generated, and data transfer between before and after the context switch can be performed correctly. Furthermore, an incomplete circuit in which a high-potential output signal and a low-potential output signal are supplied to the same node is not generated; thus, shoot-through is not generated, which leads to a reduction in power consumption.

In addition, in the operation of the semiconductor device, the frequency of the selection clock signal sel_clk can be lowered in the context switch to extend one clock cycle; thus, skew of the context signal is less unlikely to influence circuit operation. Thus, parasitic capacitance can be reduced by reducing layout area for a skew countermeasure circuit that is needed for high-speed operation and wiring routing. Consequently, the power consumption can be reduced.

<Configuration Memory>

Figure 9:
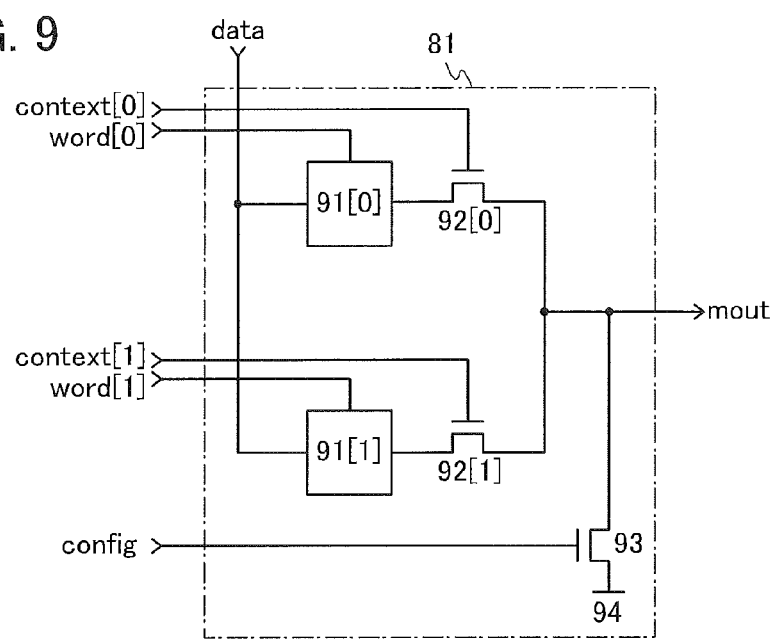
FIG. 9 is a circuit diagram illustrating a structure example of a semiconductor device.

FIG. 9 is an example of a specific circuit diagram of the configuration memories 81[0] to 81[16] in FIG. 5 and FIG. 6. A configuration memory 81 includes a memory cell 91[0], a memory cell 91[1], a transistor 92[0], a transistor 92[1], a transistor 93, and a wiring 94.

Although FIG. 8 illustrates an example where the transistor 92[0], the transistor 92[1], and the transistor 93 are n-channel transistors, one embodiment of the present invention is not limited thereto; some or all of the transistors may be p-channel transistors.

In this specification, an n-channel transistor is referred to as an n-ch transistor and a p-channel transistor is referred to as a p-ch transistor in some cases.

The memory cell 91[0] is electrically connected to one of a source and a drain of the transistor 92[0]. The memory cell 91[1] is electrically connected to one of a source and a drain of the transistor 92[1]. The other of the source and the drain of the transistor 92[0] is electrically connected to the other of the source and the drain of the transistor 92[1] and one of a source and a drain of the transistor 93. The other of the source and the drain of the transistor 93 is electrically connected to the wiring 94.

A signal data can be input to the memory cell 91[0] and the memory cell 91[1]. A signal word[0] can be input to the memory cell 91[0]. A signal word[1] can be input to the memory cell 91[1]. The context signal context[0] can be input to a gate of the transistor 92[0]. The context signal context[1] can be input to a gate of the transistor 92[1]. A signal config can be input to a gate of the transistor 93.

The memory cell 91[0] and the memory cell 91[1] each have a function of retaining configuration data. The transistor 92[0] has a function of determining, on the basis of the potential of the signal context[0], whether to output data based on configuration data retained in the memory cell 91[0] as a signal mout to the outside of the configuration memory 81. The transistor 92[1] has a function of determining, on the basis of the potential of the signal context[1], whether to output data based on configuration data retained in the memory cell 91[1] as the signal mout to the outside of the configuration memory 81.

This means that, in the case where the potential of the signal context[0] is at a high level, the potential of the signal mout is set at a high level when the potential of configuration data retained in the memory cell 91[0] is at a high level, whereas the potential of the signal mout is set at a low level when the potential of configuration data retained in the memory cell 91[0] is at a low level, for example. Furthermore, in the case where the potential of the context signal context[1] is at a high level, the potential of the signal mout is set at a high level when the potential of configuration data retained in the memory cell 91[1] is at a high level, whereas the potential of the signal mout is set at a low level when the potential of configuration data retained in the memory cell 91[1] is at a low level, for example.

Note that the logics of the context signal context[0] and the context signal context[1] can be inverted as appropriate. Furthermore, the configuration memory 81 can have a structure in which the potential of the signal mout is set at a low level when the potential of configuration data retained in the memory cell 91[0] is at a high level and the potential of the signal mout is set at a high level when the potential of configuration data retained in the memory cell 91[0] is at a low level, for example. Alternatively, the configuration memory 81 can have a structure in which the potential of the signal mout is set at a low level when the potential of configuration data retained in the memory cell 91[1] is at a high level and the potential of the signal mout is set at a high level when the potential of configuration data retained in the memory cell 91[1] is at a low level, for example.

The signal data has a function of supplying configuration data to the memory cell 91[0] and the memory cell 91[1]. The signal word[0] serves as a write control signal for controlling writing of configuration data to the memory cell 91[0]. The signal word[1] serves as a write control signal for controlling writing of configuration data to the memory cell 91[1].

The transistor 93 has a function of fixing the potential of the signal mout at the potential of the wiring 94 during configuration operation. Note that a low-level potential can be applied to the wiring 94, for example.

Figure 10A:
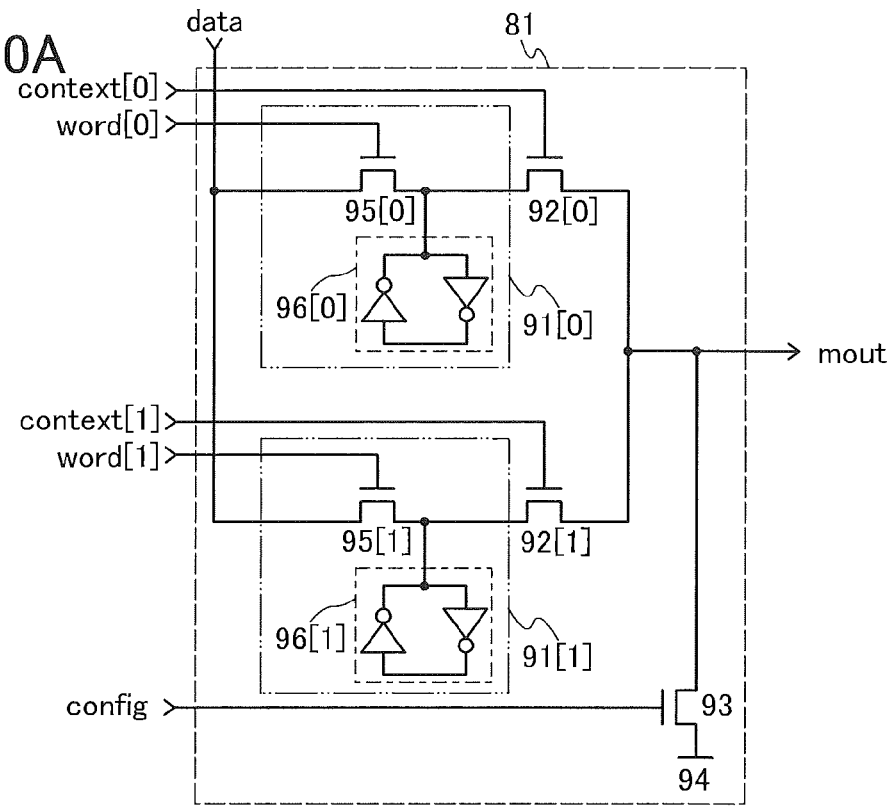
FIGS. 10A and 10B are circuit diagrams each illustrating a structure example of a semiconductor device.
Figure 10B:
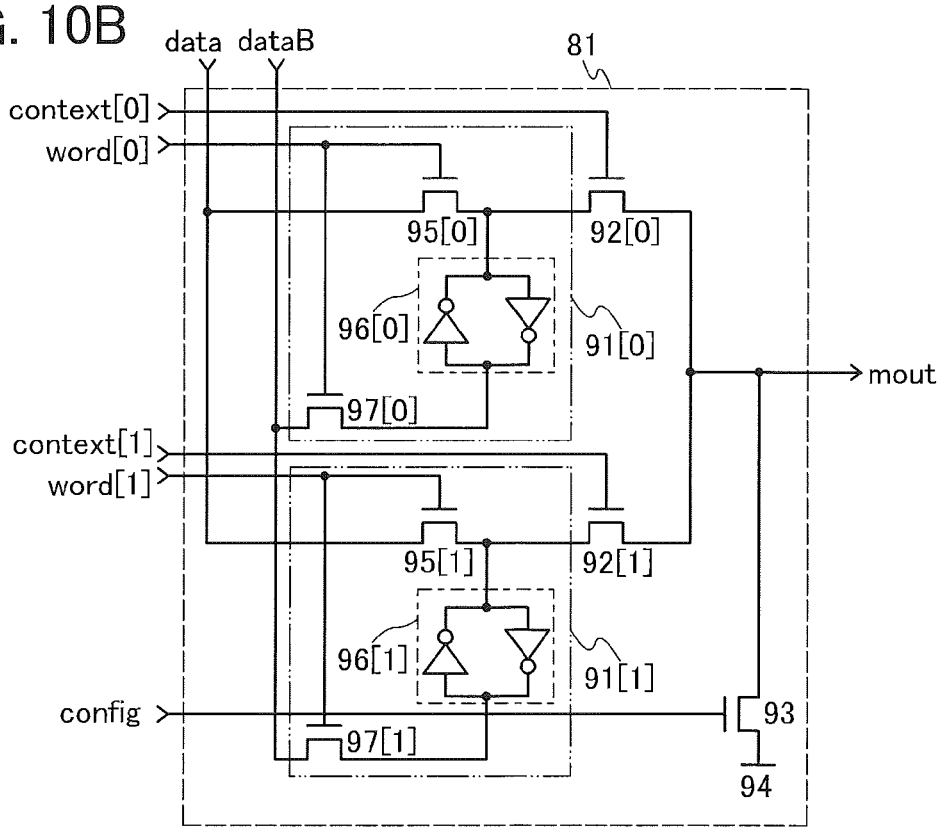

As illustrated in FIG. 10A, the memory cell 91[0] in FIG. 9 can include a transistor 95[0] and a latch circuit 96[0], and the memory cell 91[1] in FIG. 9 can include a transistor 95[1] and a latch circuit 96[1], for example. Alternatively, as illustrated in FIG. 10B, a structure in which a signal dataB, which is data (complementary data) obtained by inverting the logic of the signal data, can be supplied to the latch circuit 96[0] and the latch circuit 96[1] may be employed. In that case, the signal dataB is supplied to the latch circuit 96[0] through a transistor 97[0] and to the latch circuit 96[1] through a transistor 97[1].

Figure 11A:
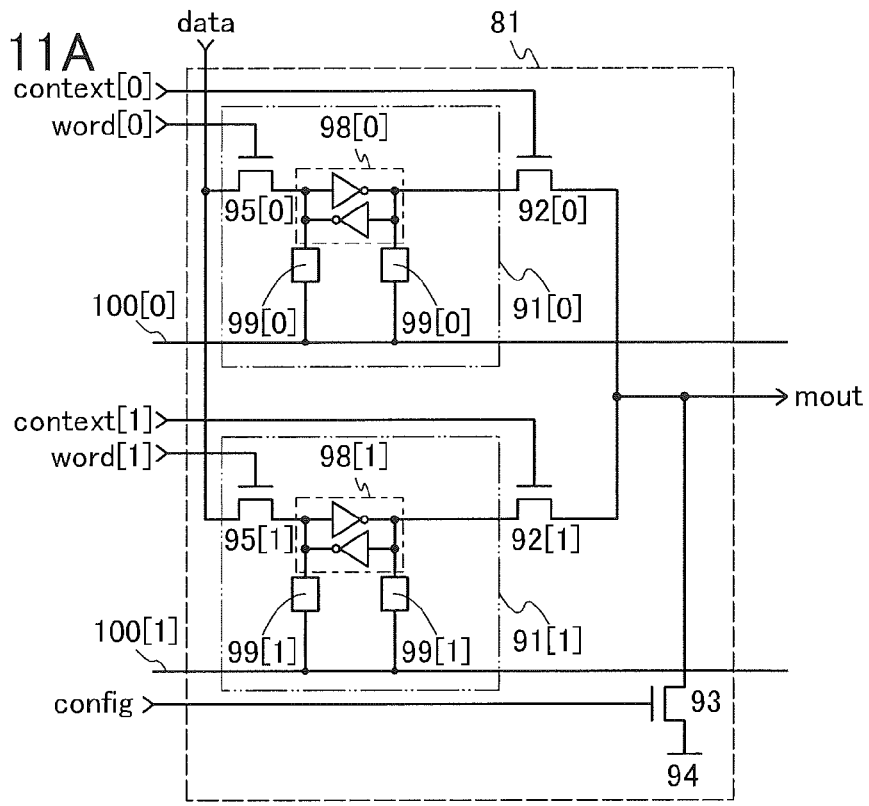
FIGS. 11A and 11B are circuit diagrams each illustrating a structure example of a semiconductor device.
Figure 11B:
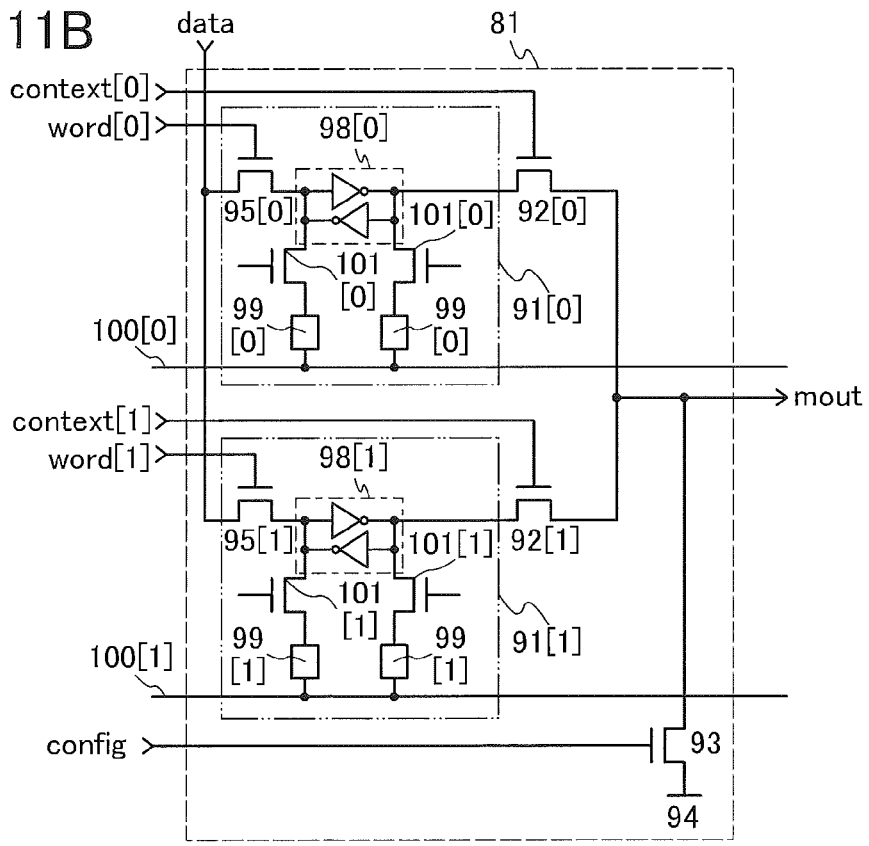

As illustrated in FIG. 11A, a structure may be employed in which the memory cell 91[0] includes the transistor 95[0], a latch circuit 98[0], magnetoresistive random access memories (MRAMs) 99[0], and a wiring 100[0] and the memory cell 91[1] includes the transistor 95[1], a latch circuit 98[1], MRAMs 99[1], and a wiring 100[1]. Alternatively, as illustrated in FIG. 11B, a structure may be employed in which the latch circuit 98[0] is connected to the MRAMs 99[0] through transistors 101[0] and the latch circuit 98[1] is connected to the MRAMs 99[1] through transistors 101[1].

Note that the memory cell 91[0] and the memory cell 91[1] with the structures in FIG. 10A or FIG. 10B do not necessarily include the latch circuit 98[0] and the latch circuit 98[1].

Figure 12:
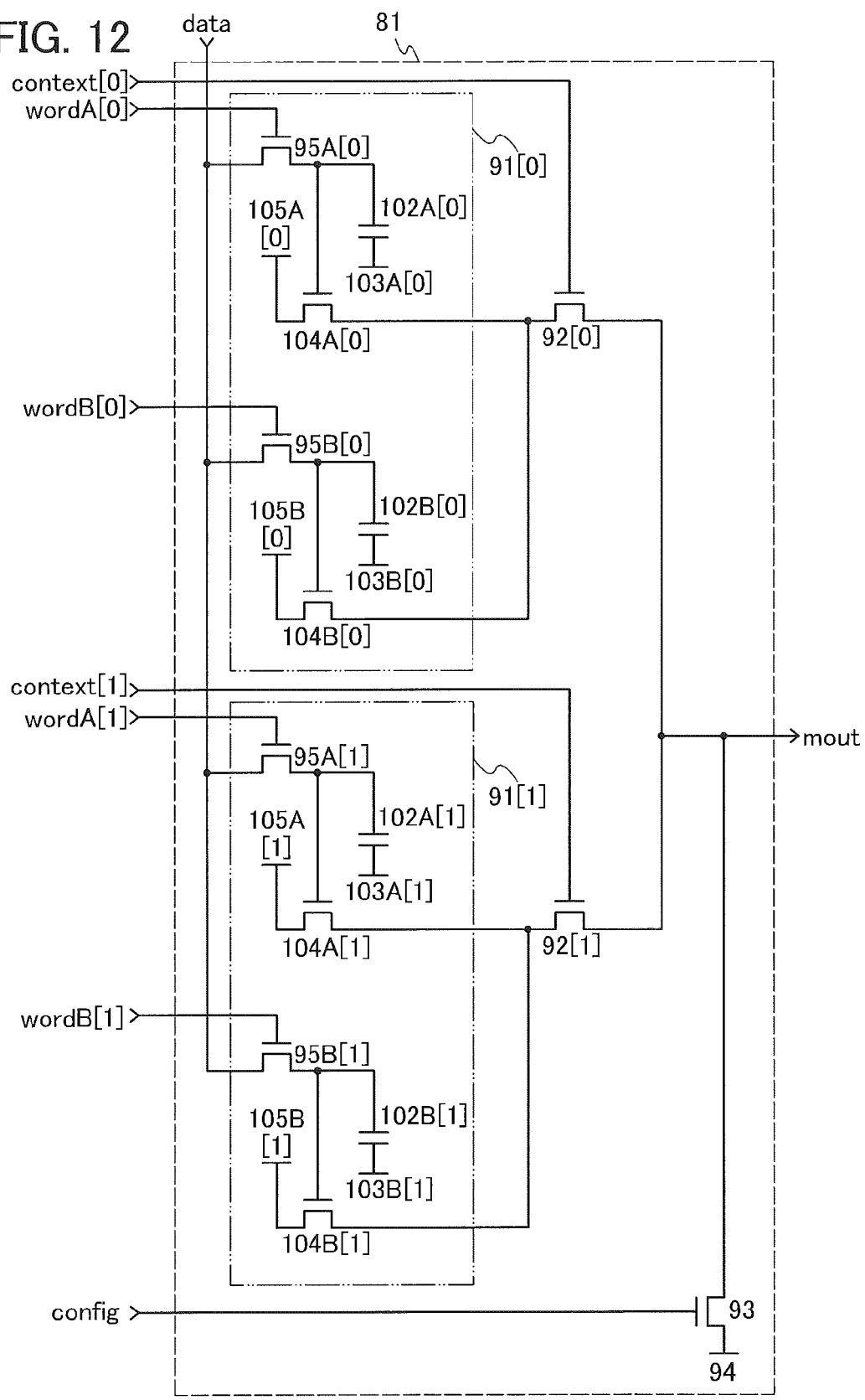
FIG. 12 is a circuit diagram illustrating a structure example of a semiconductor device.

The memory cell 91[0] and the memory cell 91[1] in FIG. 9 can have structures in FIG. 12, for example. The memory cell 91[0] in FIG. 12 includes a transistor 95A[0], a transistor 95B[0], a capacitor 102A[0], a capacitor 102B[0], a wiring 103A[0], a wiring 103B[0], a transistor 104A[0], a transistor 104B[0], a wiring 105A[0], and a wiring 105B[0]. The memory cell 91[1] includes a transistor 95A[1], a transistor 95B[1], a capacitor 102A[1], a capacitor 102B[1], a wiring 103A[1], a wiring 103B[1], a transistor 104A[1], a transistor 104B[1], a wiring 105A[1], and a wiring 105B[1].

Although an example where the transistor 95A[0], the transistor 95B[0], the transistor 95A[1], the transistor 95B[1], the transistor 104A[0], the transistor 104B[0], the transistor 104A[1], and the transistor 104B[1] are n-ch transistors is described here, one embodiment of the present invention is not limited thereto; some or all of the transistors may be p-ch transistors.

One of a source and a drain of the transistor 95A[0] is electrically connected to one terminal of the capacitor 102A[0] and a gate of the transistor 104A[0]. One of a source and a drain of the transistor 95B[0] is electrically connected to one terminal of the capacitor 102B[0] and a gate of the transistor 104B[0]. The other terminal of the capacitor 102A[0] is electrically connected to the wiring 103A[0]. The other terminal of the capacitor 102B[0] is electrically connected to the wiring 103B[0].

One of a source and a drain of the transistor 104A[0] is electrically connected to one of a source and a drain of the transistor 92[0] and one of a source and a drain of the transistor 104B[0]. The other of the source and the drain of the transistor 104A[0] is electrically connected to the wiring 105A[0]. The other of the source and the drain of the transistor 104B[0] is electrically connected to the wiring 105B[0].

One of a source and a drain of the transistor 95A[1] is electrically connected to one terminal of the capacitor 102A[1] and a gate of the transistor 104A[1]. One of a source and a drain of the transistor 95B[1] is electrically connected to one terminal of the capacitor 102B[1] and a gate of the transistor 104B[1]. The other terminal of the capacitor 102A[1] is electrically connected to the wiring 103A[1]. The other terminal of the capacitor 102B[1] is electrically connected to the wiring 103B[1].

One of a source and a drain of the transistor 104A[1] is electrically connected to one of a source and a drain of the transistor 92[1] and one of a source and a drain of the transistor 104B[1]. The other of the source and the drain of the transistor 104A[1] is electrically connected to the wiring 105A[1]. The other of the source and the drain of the transistor 104B[1] is electrically connected to the wiring 105B[1].

The potentials of the wiring 103A[0], the wiring 103B[0], the wiring 103A[1], and the wiring 103B[1] can be at a low level, for example. Furthermore, potentials with opposite logic levels are applied to the wiring 105A[0] and the wiring 105B[0], and potentials with opposite logic levels are applied to the wiring 105A[1] and the wiring 105B[1]. For example, the potential of the wiring 105B[0] is at a low level when the potential of the wiring 105A[0] is at a high level. For example, the potential of the wiring 105B[1] is at a low level when the potential of the wiring 105A[1] is at a high level.

The signal data can be input to the other of the source and the drain of the transistor 95A[0], the other of the source and the drain of the transistor 95B[0], the other of the source and the drain of the transistor 95A[1], and the other of the source and the drain of the transistor 95B[1]. A signal wordA[0] can be input to a gate of the transistor 95A[0]. A signal wordB[0] can be input to a gate of the transistor 95B[0]. A signal wordA[1] can be input to a gate of the transistor 95A[1]. A signal wordB[1] can be input to a gate of the transistor 95B[1].

Note that two types of signals word[0] can be input to the memory cell 91[0] with the structure in FIG. 12. In addition, two types of signals word[1] can be input to the memory cell 91[1] with the structure in FIG. 12. The two types of signals word[0] are described as the signal wordA[0] and the signal wordB[0], and the two types of signals word[1] are described as the signal wordA[1] and the signal wordB[1].

The transistor 95A[0] has a function of controlling writing of configuration data to the capacitor 102A[0]. The transistor 95B[0] has a function of controlling writing of configuration data to the capacitor 102B[0]. The transistor 95A[1] has a function of controlling writing of configuration data to the capacitor 102A[1]. The transistor 95B[1] has a function of controlling writing of configuration data to the capacitor 102B[1].

The capacitor 102A[0], the capacitor 102B[0], the capacitor 102A[1], and the capacitor 102B[1] each have a function of retaining configuration data. The transistor 104A[0] has a function of amplifying configuration data retained in the capacitor 102A[0]. The transistor 104B[0] has a function of amplifying configuration data retained in the capacitor 102B[0]. The transistor 104A[1] has a function of amplifying configuration data retained in the capacitor 102A[1]. The transistor 104B[1] has a function of amplifying configuration data retained in the capacitor 102B[1].

Next, procedures for retention and reading of configuration data in the memory cell 91[0] and the memory cell 91[1] with the structures in FIG. 12 are described. Note that the potentials of the wiring 105A[0] and the wiring 105A[1] are set at a high level and the potentials of the wiring 105B[0] and the wiring 105B[1] are set at a low level.

To retain configuration data with a high-level potential in the memory cell 91[0], the potentials of the signal data and the signal wordA[0] are set at a high level. As a result, charge is held in the capacitor 102A[0] and a high-level potential is applied to the gate of the transistor 104A[0]. Thus, the transistor 104A[0] is turned on. Since the potential of the wiring 105A[0] is at a high level, a signal with a high-level potential is output as the signal snout when the potential of the context signal context[0] is set at a high level and the transistor 92[0] is turned on.

To retain configuration data with a low-level potential in the memory cell 91[0], the potentials of the signal data and the signal wordB[0] are set at a high level. As a result, charge is held in the capacitor 102B[0] and a high-level potential is applied to the gate of the transistor 104B[0]. Thus, the transistor 104B[0] is turned on. Since the potential of the wiring 105B[0] is at a low level, a signal with a low-level potential is output as the signal moot when the potential of the context signal context[0] is set at a high level and the transistor 92[0] is turned on.

To retain configuration data with a high-level potential in the memory cell 91[1], the potentials of the signal data and the signal wordA[1] are set at a high level. To retain configuration data with a low-level potential in the memory cell 91[1], the potentials of the signal data and the signal wordB[1] are set at a high level.

In the memory cell 91[0] with the structure in FIG. 12, a reduction in the off-state current of the transistor 95A[0] leads to long retention time of charge written to the capacitor 102A[0], and a reduction in the off-state current of the transistor 95B[0] leads to long retention time of charge written to the capacitor 102B[0]. Furthermore, a reduction in the off-state current of the transistor 95A[1] leads to long retention time of charge written to the capacitor 102A[1], and a reduction in the off-state current of the transistor 95B[1] leads to long retention time of charge written to the capacitor 102B[1]. Here, off-state current refers to current that flows between a source and a drain when a transistor is off. For example, when the transistor is an n-ch transistor with a threshold voltage of approximately 0 to 2 V, current that flows between a source and a drain when gate voltage is negative with respect to source and drain voltages can be referred to as off-state current. Extremely low off-state current means, for example, that off-state current per micrometer of channel width is lower than or equal to 100 zA (zeptoamperes). Since the off-state current is preferably as low as possible, normalized off-state current is preferably lower than or equal to 10 zA/µm or lower than or equal to 1 zA/µm, more preferably lower than or equal to 10 yA/µm (yoctoamperes). Note that 1 zA is $1 \times 10^{-21}$ A and 1 yA is $1 \times 10^{-24}$ A.

To obtain such extremely low off-state current, a channel formation region of a transistor is formed using a semiconductor with a wide bandgap. An example of such a semiconductor is an oxide semiconductor. An oxide semiconductor has a bandgap of more than or equal to 3.0 eV; thus, a transistor whose active layer or active region contains an oxide semiconductor (an OS transistor) has low leakage current caused by thermal excitation and has extremely low off-state current. A channel formation region of an OS transistor is preferably formed using an oxide semiconductor containing at least one of indium (In) and zinc (Zn). A typical example of such an oxide semiconductor is an In-M-Zn oxide (the element M is Al, Ga, Y, or Sn, for example). By reducing impurities serving as electron donors, such as moisture or hydrogen, and also reducing oxygen vacancies, an intrinsic (i-type) or substantially i-type oxide semiconductor can be obtained. Here, such an oxide semiconductor can be referred to as a highly purified oxide semiconductor. By using a highly purified oxide semiconductor, off-state current normalized by channel width of an OS transistor can be as low as several yoctoamperes per micrometer to several zeptoamperes per micrometer.

In addition, the OS transistor has lower temperature dependence of off-state current characteristics than a transistor whose active layer or active region is formed using silicon (hereinafter such a transistor is referred to as a Si transistor). Thus, the normalized off-state current of the OS transistor can be lower than or equal to 100 zA even at high temperatures (e.g., higher than or equal to 100° C.). Accordingly, the use of an OS transistor as the transistor 95A[0] enables long-term retention of charge written to the capacitor 102A[0] even in a high temperature environment, and the use of an OS transistor as the transistor 95B[0] enables long-term retention of charge written to the capacitor 102B[0] even in a high temperature environment. Furthermore, the use of an OS transistor as the transistor 95A[1] enables long-term retention of charge written to the capacitor 102A[1] even in a high temperature environment, and the use of an OS transistor as the transistor 95B[1] enables long-term retention of charge written to the capacitor 102B[1] even in a high temperature environment. According to the above, a semiconductor device that is highly reliable even in a high temperature environment can be obtained.

Note that the transistor 92[0], the transistor 92[1], the transistor 93, the transistor 104A[0], the transistor 104B[0], the transistor 104A[1], and the transistor 104B[1] can be Si transistors. Since Si transistors have higher field-effect mobility than that of OS transistors, the amount of current flowing to the transistor 92[0], the transistor 92[1], the transistor 93, the transistor 104A[0], the transistor 104B[0], the transistor 104A[1], and the transistor 104B[1] can be increased. Thus, the semiconductor device in one embodiment of the present invention can operate at high speed.

Alternatively, the transistor 92[0], the transistor 92[1], the transistor 93, the transistor 104A[0], the transistor 104B[0], the transistor 104A[1], and the transistor 104B[1] may be OS transistors. In other words, all of the transistors included in the configuration memory 81 may be OS transistors.

Alternatively, some of the transistors included in the configuration memory 81 can be OS transistors and the rest of the transistors can be Si transistors.

The structures of the memory cell 91[0] and the memory cell 91[1] are not limited to those illustrated in FIGS. 10A and 10B, FIGS. 11A and 11B, and FIG. 12, and a resistive random access memory (ReRAM) or a flash memory may be included, for example.

Note that the circuit structures in FIG. 9, FIGS. 10A and 10B, FIGS. 11A and 11B, and FIG. 12 are only examples, and any other structures can be employed as long as one embodiment of the present invention can be achieved.
<Structure Example of Semiconductor Device Including PLE and PRS>

Figure 13:
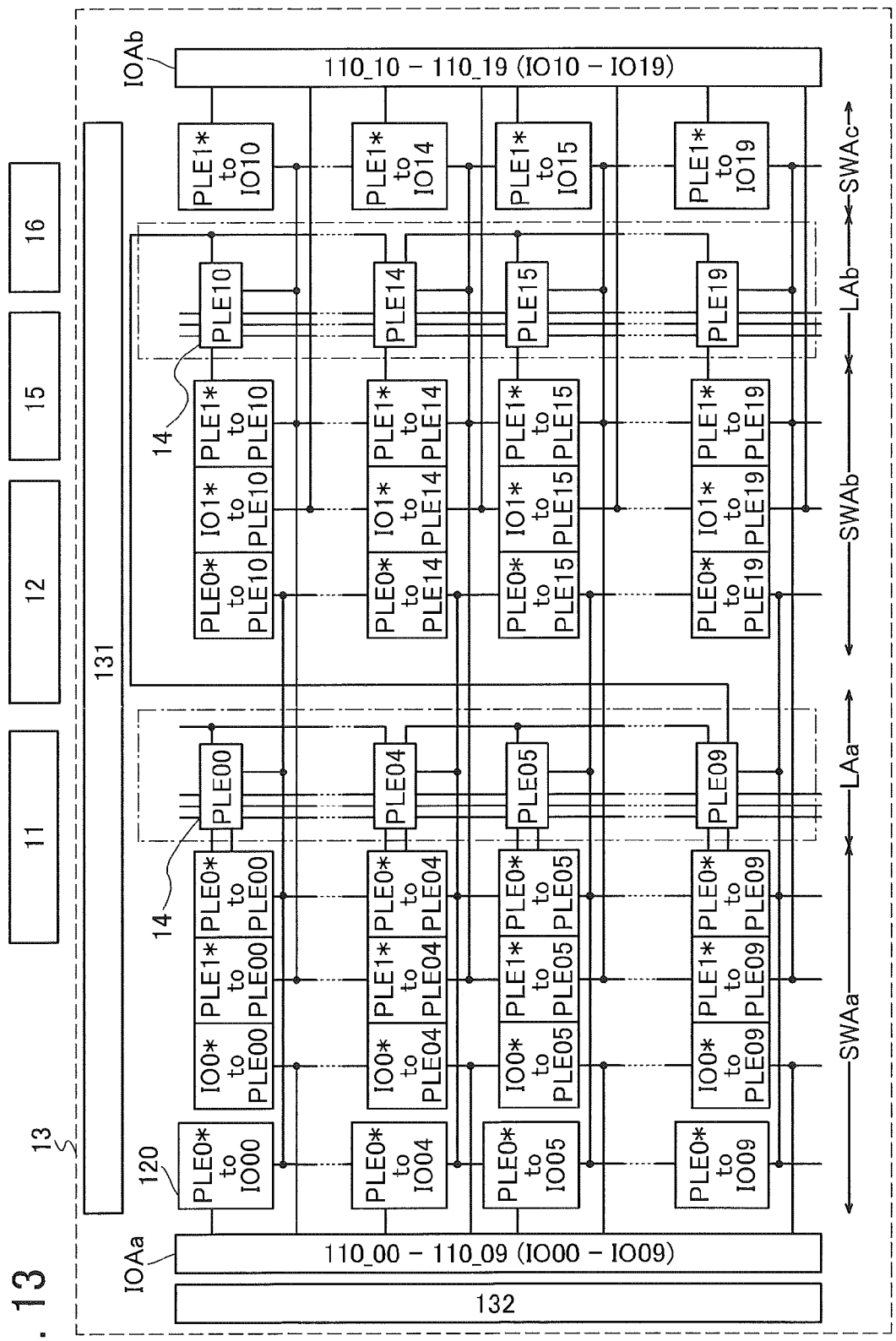
FIG. 13 is a block diagram illustrating a structure example of a semiconductor device.

FIG. 13 is a block diagram illustrating a structure example of the semiconductor device in one embodiment of the present invention. FIG. 13 illustrates connection relationships between circuits included in the PLE 14. As described above, the semiconductor device in one embodiment of the present invention includes the context controller 11, the clock generation circuit 12, the store/load controller 15, and the switch circuit 16.

The programmable circuit 13 includes, in addition to the PLEs 14, input/output circuits 110, PRSs 120, a column driver 131, and a row driver 132. Note that each of the PRSs 120 can include a configuration memory with a structure similar to the structure of the configuration memory 81.

The input/output circuits 110 each have a function of controlling input and output of signals between an external terminal included in the semiconductor device in one embodiment of the present invention and the PLEs 14. The PRSs 120 each have a function of determining connection relationships between the PLEs 14, connection relationships between the PLEs 14 and the input/output circuits 110, and the like. The column driver 131 has a function of generating the signal data. The row driver 132 has a function of generating the signal word[0] and the signal word[1].

In the example in FIG. 13, ten PLEs 14 are arranged to form a logic array LAa, and another ten PLEs 14 are arranged to form a logic array LAb. Furthermore, ten input/output circuits 110 are arranged to form an input/output array IOAa, and another ten input/output circuits 110 are arranged to form an input/output array IOAb. In addition, the PRSs 120 are arranged in a matrix to form a switch array SWAa, a switch array SWAb, and a switch array SWAc.

In this specification, ten PLEs 14 included in the logic array LAa are described as PLEs 14_00 to 14_09; ten PLEs 14 included in the logic array LAb are described as PLEs 14_10 to 14_19; ten input/output circuits 110 included in the input/output array IOAa are described as input/output circuits 110_00 to 110_09; and ten input/output circuits 110 included in the input/output array IOAb are described as input/output circuits 110_10 to 110_19.

In FIG. 13, the PLEs 14_00 to 14_19 are denoted by "PLE00" to "PLE19" and the input/output circuits 110_00 to 110_19 are denoted by "IO00" to "IO19" in some cases. Furthermore, notations for the PRSs 120 in FIG. 13 describe the functions of the PRSs 120. For example, "PLE0* to IO00" means that the PRS 120 is placed between an input node of the input/output circuit 110_00 and output nodes of the PLEs 14_00 to 14_09.

Note that the input/output circuits 110_00 to 110_19 are electrically connected to respective external terminals. The input/output arrays IOAa and IOAb each have a function of controlling input and output of signals between external terminals included in the semiconductor device in one embodiment of the present invention and the logic arrays LAa and LAb.

The structures in FIG. 1, FIG. 2, FIG. 3, FIG. 4, FIG. 5, FIG. 6, FIG. 7, FIG. 8, FIG. 9, FIGS. 10A and 10B, FIGS. 11A and 11B, FIG. 12, and FIG. 13 can be freely combined with one another.

Embodiment 2

In this embodiment, an example of a display system including the semiconductor device and an example of a display device applicable to a display device included in the display system are described.

Figure 14:
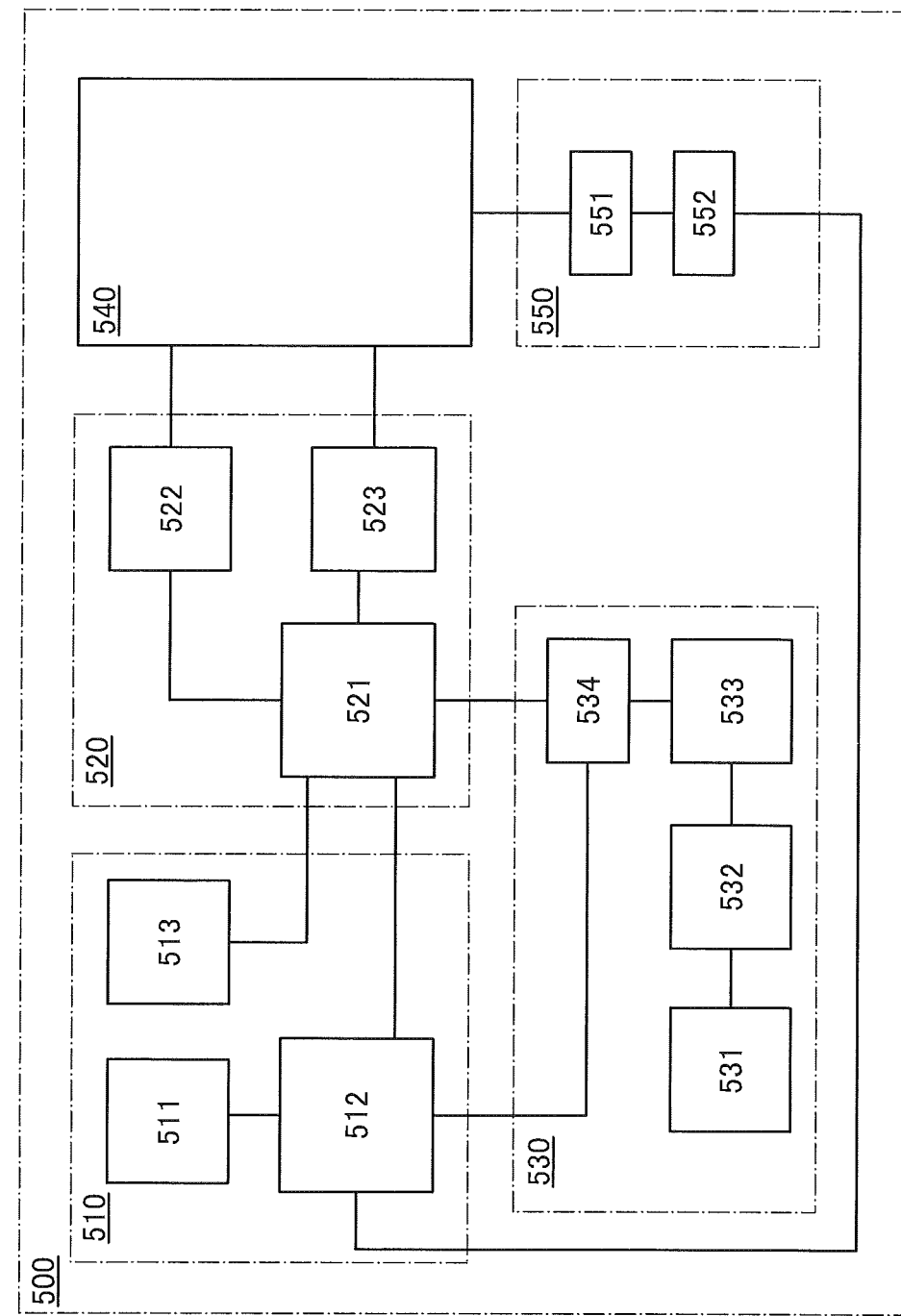
FIG. 14 is a block diagram illustrating a display system.

FIG. 14 is a block diagram illustrating a structure example of a display system.

A display system 500 includes a video data communication portion 510, a display driver portion 520, a power source control portion 530, a display device portion 540, and a touch panel portion 550.

The video data communication portion 510 includes a wireless signal reception portion 511, a processor 512, and a video data input portion 513. The wireless signal reception portion 511 has a function of being connected to a wireless local area network (LAN) to receive video data or the like. The processor 512 decodes video data or the like received in the wireless signal reception portion 511 and outputs the decoded video data or the like to the display driver portion 520. The video data input portion 513 corresponds to an input terminal when video data is directly input from the outside. Video data input to the video data input portion 513 is output to the display driver portion 520.

The display driver portion 520 includes a PLD 521, a display controller 522, and a power supply circuit 523. The PLD 521 can have any of the structures described in the above embodiment. Thus, signal processing of video data with different formats can be performed during context switch, and data transfer between before and after the context switch can be performed correctly even at high clock frequency. The display controller 522 generates a video signal and a control signal for driving the display device portion 540 on the basis of video data processed in the PLD 521 and outputs the video signal and the control signal to the display device portion 540. The power supply circuit 523 generates power supply voltage for driving the display device portion 540 on the basis of video data processed in the PLD 521 and outputs the power supply voltage to the display device portion 540.

The power source control portion 530 includes a wireless power supply module 531, a secondary battery 532, a voltage conversion circuit 533, and a power source controller 534. Power is wirelessly supplied to the wireless power supply module 531 under a wireless power supply standard. The secondary battery 532 is charged with power obtained by supply of power to the wireless power supply module 531. The voltage conversion circuit 533 converts voltage generated by discharge of the secondary battery 532 and outputs the converted voltage to the power source controller 534. The power source controller 534 controls output of power used for each circuit of the display system 500.

The display device portion 540 includes, in addition to a display region including a plurality of pixels, driver circuits such as a scan line driver circuit and a signal line driver circuit that control writing of a video signal to each pixel. Structure examples of the display device portion 540 are described in detail with reference to FIGS. 15A to 15C and FIGS. 16A and 16B.

The touch panel portion 550 includes a detection circuit 551 and an arithmetic circuit 552. The detection circuit 551 outputs an electrical signal obtained by detection of an object to be detected to the arithmetic circuit 552. The arithmetic circuit 552 performs arithmetic operation for identifying the position of an object to be detected on the basis of an electrical signal obtained by the detection circuit 551 and outputs an arithmetic operation result to the processor 512.

Figure 15A:
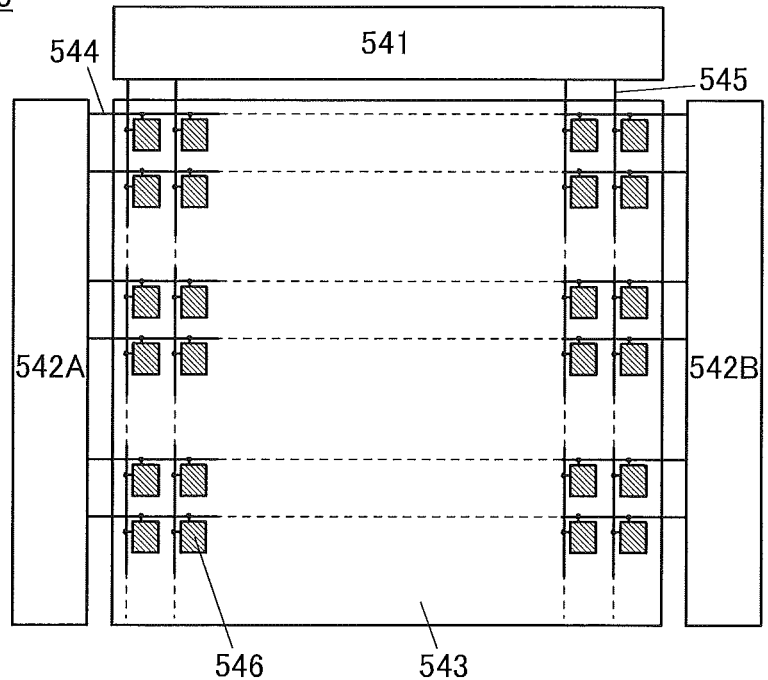
FIG. 15A is a block diagram illustrating a display device portion.

FIG. 15A is a block diagram illustrating a structure example of the display device portion 540.

The display device portion 540 in FIG. 15A includes driver circuits 541, 542A, and 542B, and a display region 543. Note that the driver circuits 541, 542A, and 542B are collectively referred to as a driver circuit or a peripheral driver circuit in some cases.

The driver circuits 542A and 542B can function as, for example, scan line driver circuits. The driver circuit 541 can function as, for example, a signal line driver circuit. Note that one of the driver circuits 542A and 542B may be omitted. Alternatively, some sort of circuit facing the driver circuit 541 with the display region 543 positioned therebetween may be provided.

The display device portion 540 illustrated in FIG. 15A includes p wirings 544 that are arranged substantially parallel to each other and whose potentials are controlled by the driver circuit 542A and/or the driver circuit 542B, and q wirings 545 that are arranged substantially parallel to each other and whose potentials are controlled by the driver circuit 541. The display region 543 includes a plurality of pixels 546 arranged in a matrix. The pixel 546 includes a pixel circuit and a display element.

When every three pixels 546 function as one pixel, full-color display can be achieved. The three pixels 546 control the transmittance, reflectance, amount of emitted light, or the like of red light, green light, or blue light. The light colors controlled by the three pixels 546 are not limited to the combination of red, green, and blue, and may be yellow, cyan, and magenta.

A pixel 546 that controls white light may be added to the pixels that control red light, green light, and blue light so that the four pixels 546 collectively function as one pixel. The addition of the pixel 546 that controls white light can increase the luminance of the display region. When the number of pixels 546 functioning as one pixel is increased to use red, green, blue, yellow, cyan, and magenta in appropriate combination, the range of color reproduction can be widened.

For example, using pixels arranged in a matrix of 1920× 1080, the display device portion 540 that can display an image with "full high definition" (also referred to as "2K resolution," "2K1K," "2K," and the like) can be obtained. Using pixels arranged in a matrix of 3840×2160, the display device portion 540 that can display an image with "ultra-high definition" (also referred to as "4K resolution," "4K2K," "4K," and the like) can be obtained. Using pixels arranged in a matrix of 7680×4320, the display device portion 540 that can display an image with "super high definition" (also referred to as "8K resolution," "8K4K," "8K," and the like) can be obtained. Using a larger number of pixels, the display device portion 540 that can display an image with 16K or 32K resolution can be obtained.

A wiring 544_g in a g-th row (g is a natural number of larger than or equal to 1 and smaller than or equal top) is electrically connected to q pixels 546 in the g-th row among the plurality of pixels 546 arranged in p rows and q columns (p and q are each a natural number of larger than or equal to 1) in the display region 543. A wiring 545_h in an h-th column (h is a natural number of larger than or equal to 1 and smaller than or equal to q) is electrically connected to p pixels 546 in the h-th column among the plurality of pixels 546 arranged in p rows and q columns.

[Display Element]

The display device portion 540 can employ various modes and include various display elements. Examples of the display element include a display element including a display medium whose contrast, luminance, reflectance, transmittance, or the like is changed by electrical or magnetic action, such as an electroluminescence (EL) element (e.g., an organic EL element, an inorganic EL element, or an EL element including organic and inorganic materials), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, or a display element using a carbon nanotube. Alternatively, quantum dots may be used as the display element.

Examples of display devices using EL elements include an EL display. Examples of display devices including electron emitters are a field emission display (FED) and an SED-type flat panel display (SED: surface-conduction electron-emitter display). Examples of display devices including quantum dots include a quantum dot display. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. The display device may be a plasma display panel (PDP). The display device may be a retina scanning-type projection device.

In the case of a transflective liquid crystal display or a reflective liquid crystal display, some or all of pixel electrodes function as reflective electrodes. For example, some or all of pixel electrodes contain aluminum, silver, or the like. In such a case, a memory circuit such as an SRAM can be provided below the reflective electrodes. Thus, power consumption can be further reduced.

Note that in the case of using an LED, graphene or graphite may be provided below an electrode or a nitride semiconductor of the LED. Graphene or graphite may be a multilayer film in which a plurality of layers are stacked. Providing graphene or graphite in such a manner enables easy formation of a nitride semiconductor film thereover, such as an n-type GaN semiconductor layer including crystals. Furthermore, a p-type GaN semiconductor layer including crystals, or the like, can be provided thereover, and thus the LED can be formed. Note that an MN layer may be provided between the n-type GaN semiconductor layer including crystals and graphene or graphite. The GaN semiconductor layers included in the LED may be formed by MOCVD. Note that when graphene is provided, the GaN semiconductor layers included in the LED can also be formed by sputtering.

[Example of Pixel Including Light-Emitting Element]

Figure 15B:
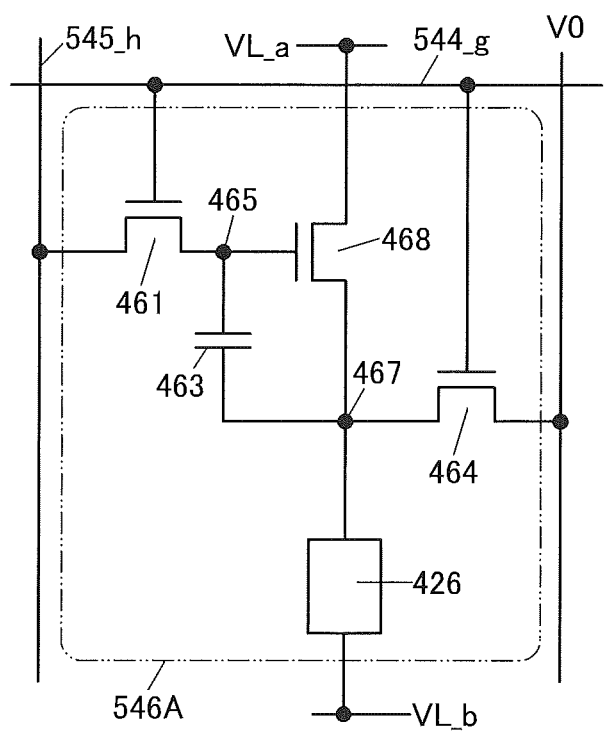
FIGS. 15B and 15C are circuit diagrams each illustrating a pixel example.

A pixel 546A in FIG. 15B includes a transistor 461, a capacitor 463, a transistor 468, a transistor 464, and a light-emitting element 426 that can function as a display element.

One of a source and a drain of the transistor 461 is electrically connected to the wiring 545_*h*. A gate of the transistor 461 is electrically connected to the wiring 544_*g*. The wiring 545_*h* supplies a video signal.

The transistor 461 has a function of controlling writing of a video signal to a node 465.

One of a pair of electrodes of the capacitor 463 is electrically connected to the node 465, and the other of the pair of electrodes of the capacitor 463 is electrically connected to a node 467. The other of the source and the drain of the transistor 461 is electrically connected to the node 465.

The capacitor 463 functions as a storage capacitor for retaining data written to the node 465.

One of a source and a drain of the transistor 468 is electrically connected to a potential supply line VL_a, and the other of the source and the drain of the transistor 468 is electrically connected to the node 467. A gate of the transistor 468 is electrically connected to the node 465.

One of a source and a drain of the transistor 464 is electrically connected to a wiring V0, and the other of the source and the drain of the transistor 464 is electrically connected to the node 467. A gate of the transistor 464 is electrically connected to the wiring 544_*g*.

One of an anode and a cathode of the light-emitting element 426 is electrically connected to a potential supply line VL_b, and the other of the anode and the cathode of the light-emitting element 426 is electrically connected to the node 467.

As the light-emitting element 426, an organic electroluminescence element (also referred to as an organic EL element) or the like can be used, for example. Note that the light-emitting element 426 is not limited thereto and may be an inorganic EL element containing an inorganic material, for example.

A high power supply potential VDD is applied to one of the potential supply line VL_a and the potential supply line VL_b, and a low power supply potential VSS is applied to the other of the potential supply line VL_a and the potential supply line VL_b, for example.

In the display device portion 540 including the pixels 546A in FIG. 15B, the pixels 546 are sequentially selected row by row by the driver circuit 542A and/or the driver circuit 542B, so that the transistor 461 is turned on and a video signal is written to the node 465.

The pixel 546A in which data is written to the node 465 is brought into a retention state when the transistors 461 and 464 are turned off. The amount of current flowing between the source and the drain of the transistor 468 is controlled in accordance with the potential of the data written to the node 465. The light-emitting element 426 emits light with luminance corresponding to the amount of flowing current. This operation is sequentially performed row by row; thus, an image can be displayed.

The transistors 461, 464, and 468 may be transistors with back gates. In that case, in each of the transistors 461, 464, and 468, the gate may be electrically connected to the back gate.

[Example of Pixel Including Liquid Crystal Element]

Figure 15C:
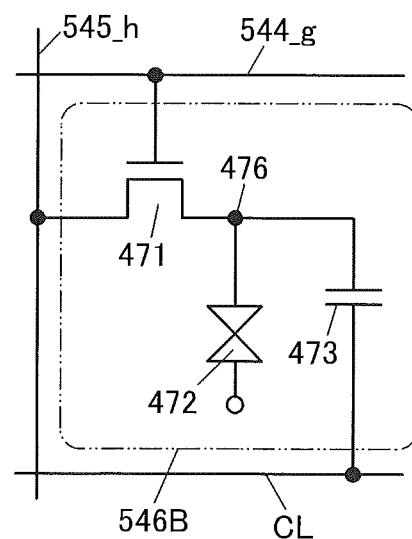

A pixel 546B in FIG. 15C includes a transistor 471, a capacitor 473, and a liquid crystal element 472.

The potential of one of a pair of electrodes of the liquid crystal element 472 is set as appropriate according to the specifications of the pixel 546B. For example, one of the pair of electrodes of the liquid crystal element 472 may be supplied with a common potential, or may have the same potential as a capacitor line CL. Furthermore, the potential applied to one of the pair of electrodes of the liquid crystal element 472 may be different among the pixels 546B. The other of the pair of electrodes of the liquid crystal element 472 is electrically connected to a node 476. The alignment state of the liquid crystal element 472 depends on data written to the node 476.

As a method for driving the display device including the liquid crystal element 472, any of the following modes can be used, for example: a twisted nematic (TN) mode, a super-twisted nematic (STN) mode, a vertical alignment (VA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, a multi-domain vertical alignment (MVA) mode, a patterned vertical alignment (PVA) mode, an in-plane switching (IPS) mode, a fringe field switching (FFS) mode, a transverse bend alignment (TBA) mode, and the like. Other examples of the method for driving the display device include an electrically controlled birefringence (ECB) mode, a polymer dispersed liquid crystal (PDLC) mode, a polymer network liquid crystal (PNLC) mode, and a guest-host mode. Note that one embodiment of the present invention is not limited thereto, and various liquid crystal elements and driving methods can be used.

In the case where a liquid crystal element is used as the display element, thermotropic liquid crystal, low-molecular liquid crystal, high-molecular liquid crystal, polymer-dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like, depending on conditions.

Alternatively, a liquid crystal exhibiting a blue phase for which an alignment film is unnecessary may be used. A blue phase is one of liquid crystal phases, which is generated immediately before a cholesteric phase changes into an isotropic phase while the temperature of cholesteric liquid crystal is increased. Since the blue phase appears only in a narrow temperature range, a liquid crystal composition in which 5 wt. % or more of a chiral material is mixed is used for a liquid crystal layer in order to improve the temperature range. The liquid crystal composition that includes the liquid crystal exhibiting a blue phase and a chiral material has a short response time of 1 ms or less, and has optical isotropy, which makes alignment process unnecessary and viewing angle dependence small. An alignment film does not need to be provided and rubbing treatment is thus not necessary; accordingly, electrostatic discharge caused by the rubbing treatment can be prevented and defects and damage of the liquid crystal display device in manufacturing process can be reduced. Thus, productivity of the liquid crystal display device can be improved.

Furthermore, it is possible to use a method called domain multiplication or multi-domain design, in which a pixel is divided into some regions (subpixels) and molecules are aligned in different directions.

The specific resistance of the liquid crystal material is greater than or equal to $1\times10^9$ Ω·cm, preferably greater than or equal to $1\times10^{11}$ Ω·cm, more preferably greater than or equal to $1\times10^{12}$ Ω·cm. Note that the specific resistance in this specification is measured at 20° C.

In the pixel 546B in the g-th row and the h-th column, one of the source and the drain of the transistor 471 is electrically connected to the wiring 544_h, and the other of the source and the drain of the transistor 471 is electrically connected to the node 476. The gate of the transistor 471 is electrically connected to the wiring 544_g. The wiring 545_h supplies a video signal. The transistor 471 has a function of controlling writing of a video signal to the node 476.

One of a pair of electrodes of the capacitor 473 is electrically connected to a wiring to which a particular potential is supplied (hereinafter referred to as the capacitor line CL), and the other of the pair of electrodes of the capacitor 473 is electrically connected to the node 476. The potential of the capacitor line CL is set as appropriate according to the specifications of the pixel 546B. The capacitor 473 functions as a storage capacitor for retaining data written to the node 476.

For example, in the display device portion 540 including the pixels 546B in FIG. 15C, the pixels 546B are sequentially selected row by row by the driver circuit 542A and/or the driver circuit 542B, so that the transistors 471 are turned on and a video signal is written to the node 476.

The pixel 546B in which the video signal is written to the node 476 is brought into a retention state when the transistor 471 is turned off. This operation is sequentially performed row by row; thus, an image can be displayed on the display region 543.

The transistor 471 may be a transistor with a back gate. In that case, the gate of the transistor 471 may be electrically connected to the back gate.

[Example of Pixel Including Liquid Crystal Element and Light-Emitting Element]

Figure 16A:
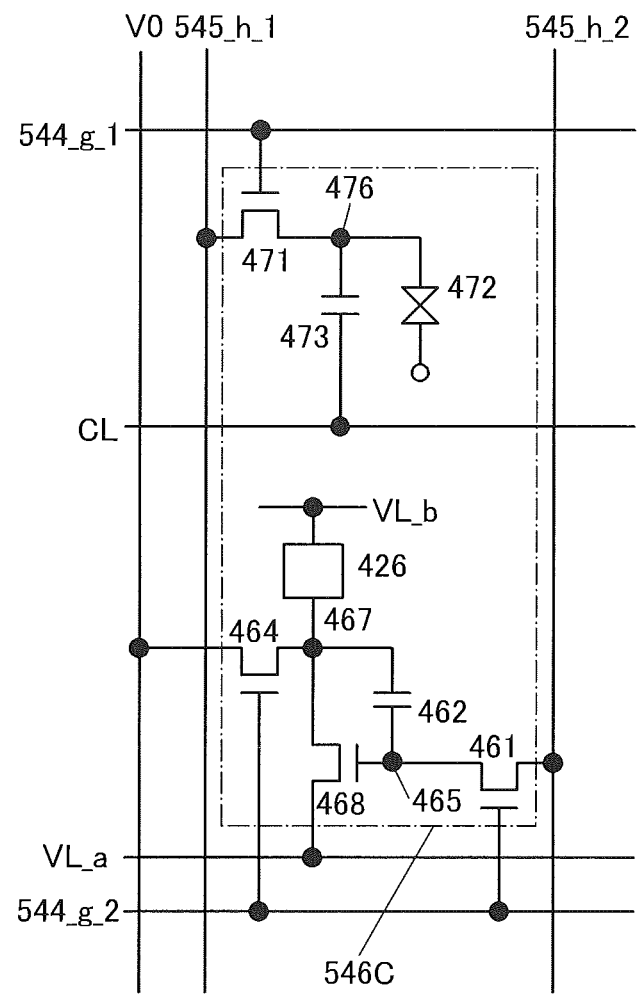
FIG. 16A is a circuit diagram illustrating a pixel example.

A pixel 546C in FIG. 16A includes the transistor 461, the capacitor 463, the transistor 468, the transistor 464, the light-emitting element 426, the transistor 471, the capacitor 473, and the liquid crystal element 472.

The pixel 546C in FIG. 16A has the structure of the pixel 546A in FIG. 15B and the structure of the pixel 546B in FIG. 15C. A video signal supplied to the node 476 is supplied to a wiring 545_h_1. The video signal of the wiring 545_h_1 is written through the transistor 471 whose gate is electrically connected to a wiring 544_g_1. A video signal supplied to the node 465 is supplied to a wiring 545_h_2. The video signal of the wiring 545_h_2 is written through the transistor 461 whose gate is electrically connected to a wiring 544_g_2. Description of driving of the light-emitting element 426 and the liquid crystal element 472 in the pixel 546C in FIG. 16A is similar to description of the pixel 546A in FIG. 15B and description of the pixel 546B in FIG. 15C, and the above descriptions can be referred to.

Figure 16B:
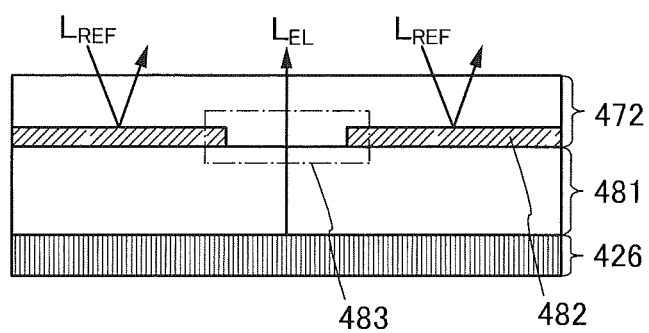
FIG. 16B is a cross-sectional schematic view illustrating the pixel example.

In the display device portion 540 including the pixel 546C in FIG. 16A, the light-emitting element 426 can overlap with the liquid crystal element 472 as illustrated in a cross-sectional schematic view in FIG. 16B. In FIG. 16B, a layer 481 including transistors is provided between the light-emitting element 426 and the liquid crystal element 472. The layer 481 including transistors includes the transistor 461, the capacitor 463, the transistor 468, the transistor 464, the transistor 471, and the capacitor 473. The liquid crystal element 472 in FIG. 16B includes an electrode 482 that can reflect external light ($L_{REF}$). The electrode 482 includes an opening 483 for transmitting light ($L_{EL}$) from the light-emitting element.

In the pixel 546C in FIG. 16A, the light-emitting element 426 and the liquid crystal element 472 can be separately driven. In other words, the light-emitting element 426 and the liquid crystal element 472 in FIG. 16B can be separately driven. Therefore, the display device portion 540 including the pixel 546C in FIG. 16A can switch driving of the light-emitting element 426 and the liquid crystal element 472 depending on illuminance. For example, when illuminance is high, the liquid crystal element 472 is driven to obtain a desired grayscale. When illuminance is low, the light-emitting element 426 is driven to obtain a desired grayscale. With such a structure, it is possible to obtain a display device portion with low power consumption and high visibility.

Embodiment 3

In this embodiment, an IC chip, an electronic component, electronic devices, and the like are described as examples of a semiconductor device.

<Example of Method for Manufacturing Electronic Component>

FIG. 17A is a flow chart showing an example of a method for manufacturing an electronic component. The electronic component is also referred to as a semiconductor package or an IC package. This electronic component has a plurality of standards and names depending on a terminal extraction direction and a terminal shape. Examples of the electronic component are described in this embodiment.

A semiconductor device including a transistor is completed by integrating detachable components on a printed wiring board through an assembly process (post-process). The post-process can be finished through steps in FIG. 17A. Specifically, after an element substrate obtained in a wafer process is completed (step ST71), a rear surface of the substrate is ground. The substrate is thinned in this step to reduce warpage or the like of the substrate in the wafer process and to reduce the size of the electronic component. Next, the substrate is divided into a plurality of chips in a dicing step (step ST72).

FIG. 17B is a top view of a semiconductor wafer 7100 before the dicing step. FIG. 17C is a partial enlarged view of FIG. 17B. A plurality of circuit regions 7102 are provided over the semiconductor wafer 7100. The semiconductor device in one embodiment of the present invention is provided in the circuit region 7102.

The plurality of circuit regions 7102 are each surrounded by a separation region 7104. Separation lines (also referred to as dicing lines) 7106 are set at a position overlapping with the separation regions 7104. The semiconductor wafer 7100 is cut along the separation lines 7106 into chips 7110 including the circuit regions 7102 in the dicing step (step ST72). FIG. 17D is an enlarged view of the chip 7110.

A conductive layer or a semiconductor layer may be provided in the separation regions 7104. Providing a conductive layer or a semiconductor layer in the separation regions 7104 relieves ESD that might be caused in the dicing step, which prevents a decrease in yield caused by the dicing step. A dicing step is generally performed while supplying pure water whose specific resistance is decreased by dissolution of a carbonic acid gas or the like to a cut portion, in order to cool down a substrate, remove swarf, and prevent electrification, for example. Providing a conductive layer or a semiconductor layer in the separation regions 7104 allows a reduction in the usage of pure water. Therefore, the cost of manufacturing semiconductor devices can be reduced. In addition, semiconductor devices can be manufactured with improved productivity.

After Step ST72, the divided chips are separately picked up to be mounted on and bonded to a lead frame in a die bonding step (step ST73). In the die bonding step, the chip is bonded to the lead frame by an appropriate method depending on a product, for example, bonding with a resin or a tape. In the die bonding step, the chip may be mounted on an interposer to be bonded. In a wire bonding step, lead of the lead frame is electrically connected to an electrode on the chip with a metal fine line (wire) (step ST74). A silver line or a gold line can be used as the metal fine line. Either ball bonding or wedge bonding may be used as wire bonding.

A molding step is performed to seal the wire bonded chip with an epoxy resin or the like (step ST75). With the molding step, the electronic component is filled with the resin, so that damage to a mounted circuit portion or wire due to mechanical external force can be reduced. Furthermore, degradation in characteristics due to moisture or dust can be reduced. The lead of the lead frame is plated. After that, the lead is cut and processed (step ST76). This plating step prevents rust of the lead and ensures soldering at the time of mounting the chip on a printed wiring board in a later step. Printing (marking) is performed on a surface of the package (step ST77). Through an inspection step (step ST78), the electronic component is completed (step ST79). When the electronic component includes the semiconductor device described in the above embodiment, a low-power small electronic component can be provided.

FIG. 17E is a schematic perspective view of the completed electronic component. FIG. 17E illustrates a schematic perspective view of a quad flat package (QFP) as an example of the electronic component. As illustrated in FIG. 17E, an electronic component 7000 includes a lead 7001 and a chip 7110.

The electronic component 7000 is mounted on a printed wiring board 7002, for example. When a plurality of electronic components 7000 are used in combination and electrically connected to each other over the printed wiring board 7002, the electronic components 7000 can be mounted on an electronic device. A completed circuit board 7004 is provided in the electronic device or the like. When an electronic device includes the electronic component 7000, the power consumption of the electronic device can be reduced. Alternatively, the electronic device can have smaller size.

The electronic component 7000 can be used as an electronic component (IC chip) of electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Examples of such an electronic device include cameras (e.g., video cameras and digital still cameras), display devices, personal computers (PC), cellular phones, game machines including portable game machines, portable information terminals (e.g., smartphones and tablet information terminals), e-book readers, wearable information terminals (e.g., watch-type information terminals, head-mounted information terminals, goggle-type information terminals, glasses-type information terminals, armband-type information terminals, bracelet-type information terminals, and necklace-type information terminals), navigation systems, audio reproducing devices (e.g., car audio players and digital audio players), copiers, facsimiles, printers, multifunction printers, automated teller machines (ATM), vending machines, and consumer electronics.

Then, applications of the electronic component to an electronic device such as a computer, a portable information terminal (including a cellular phone, a portable game machine, an audio reproducing device, and the like), electronic paper, a television device (also referred to as a television or a television receiver), or a digital video camera are described.

Figure 18A:
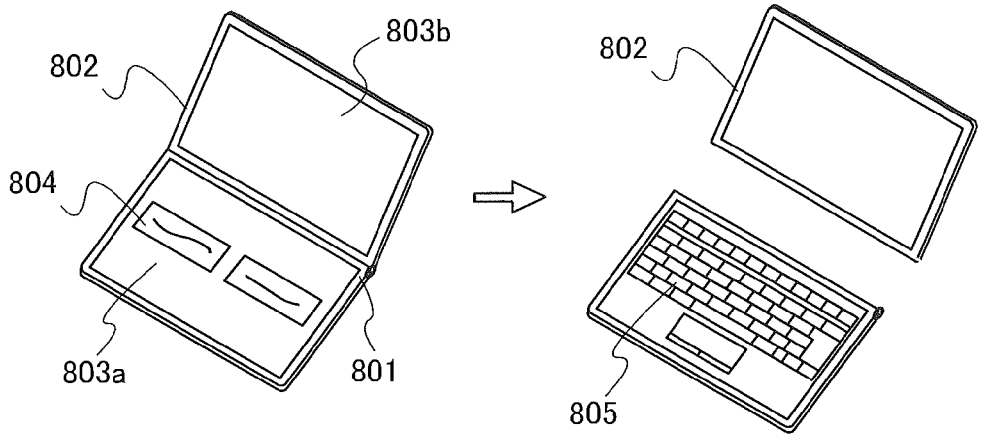
FIGS. 18A to 18E illustrate electronic devices.

FIG. 18A illustrates a portable information terminal, which includes a housing 801, a housing 802, a first display portion 803a, a second display portion 803b, and the like. The semiconductor device described in the above embodiment is provided in at least one of the housings 801 and 802. Thus, a low-power portable information terminal is obtained.

Note that the first display portion 803a is a touch panel, and for example, as illustrated in the left of FIG. 18A, which of "touch input" and "keyboard input" is performed can be selected by a selection button 804 displayed on the first display portion 803a. Since the selection buttons with a variety of sizes can be displayed, the portable information terminal can be easily used by people of any generation. In the case where "keyboard input" is selected, for example, a keyboard 805 is displayed on the first display portion 803a as illustrated in the right of FIG. 18A. With the keyboard

805, letters can be input quickly by keyboard input as in the case of using a conventional information terminal, for example.

Furthermore, one of the first display portion 803*a* and the second display portion 803*b* can be detached from the portable information terminal as illustrated in the right in FIG. 18A. The second display portion 803*b* can also function as a touch panel for a reduction in weight to carry around to be operated by one hand while the other hand supports the housing 802, which is convenient.

The portable information terminal in FIG. 18A can have a function of displaying various kinds of information (e.g., a still image, a moving image, and a text image), a function of displaying a calendar, a date, the time, or the like on the display portion, a function of operating or editing the information displayed on the display portion, a function of controlling processing by various kinds of software (programs), and the like. Furthermore, an external connection terminal (e.g., an earphone terminal or a USB terminal), a recording medium insertion portion, and the like may be provided on the rear surface or the side surface of the housing.

The portable information terminal in FIG. 18A may transmit and receive data wirelessly. Through wireless communication, desired book data or the like can be purchased and downloaded from an electronic book server.

Furthermore, the housing 802 in FIG. 18A may have an antenna, a microphone function, or a wireless communication function to be used as a cellular phone.

Figure 18B:
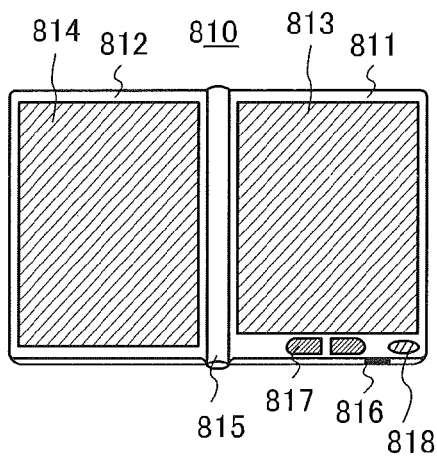

FIG. 18B illustrates an e-book reader 810 including electronic paper. The e-book reader 810 includes two housings 811 and 812. The housing 811 and the housing 812 include a display portion 813 and a display portion 814, respectively. The housings 811 and 812 are connected to each other by a hinge 815, so that the e-book reader 810 can be opened and closed using the hinge 815 as an axis. The housing 811 includes a power button 816, operation keys 817, a speaker 818, and the like. The semiconductor device described in the above embodiment is provided in at least one of the housings 811 and 812. Thus, a low-power e-book reader is obtained.

Figure 18C:
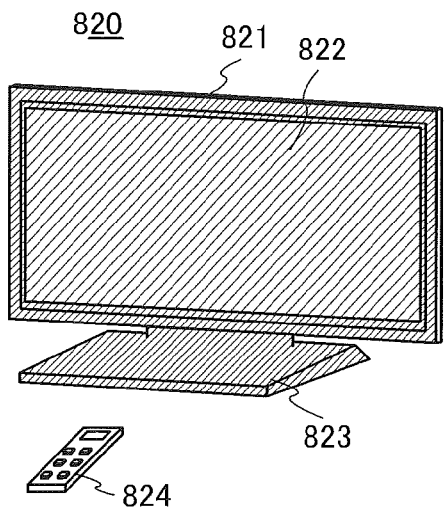

FIG. 18C is a television device, which includes a housing 821, a display portion 822, a stand 823, and the like. The television device 820 can be operated with a switch of the housing 821 and a remote control 824. The semiconductor device described in the above embodiment is provided in the housing 821 and the remote control 824. Thus, a low-power television device is obtained.

Figure 18D:
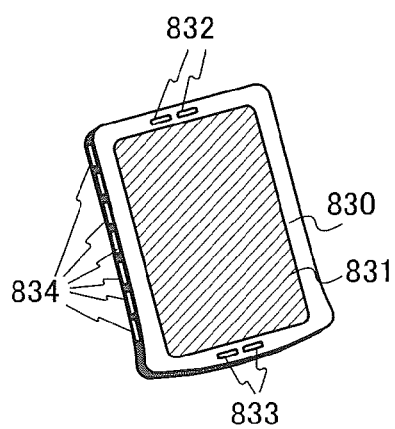

FIG. 18D illustrates a smartphone in which a main body 830 includes a display portion 831, a speaker 832, a microphone 833, operation buttons 834, and the like. The semiconductor device described in the above embodiment is provided in the main body 830. This allows the smartphone to be less likely to malfunction and to have lower power consumption.

Figure 18E:
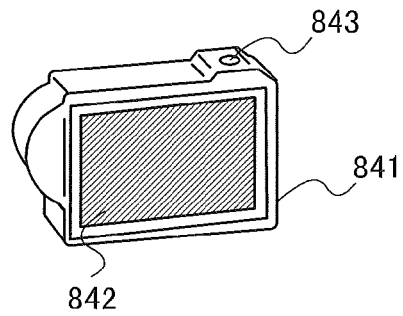

FIG. 18E illustrates a digital camera, which includes a main body 841, a display portion 842, an operation switch 843, and the like. The semiconductor device described in the above embodiment is provided in the main body 841. Thus, a low-power digital camera is obtained.

As described above, the semiconductor device described in the above embodiment is provided in each of the electronic devices described in this embodiment. Thus, a low-power electronic device is obtained.

(Notes on the Description of the Specification and the Like)

The following are notes on the description of the above embodiments and structures in the embodiments.

<Notes on One Embodiment of the Present Invention Described in Embodiments>

One embodiment of the present invention can be constituted by combining the structure described in an embodiment with any of the structures described in the other embodiments as appropriate. In addition, in the case where a plurality of structure examples are described in one embodiment, some of the structure examples can be combined as appropriate.

Note that what is described (or part thereof) in an embodiment can be applied to, combined with, or replaced with another content in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

In this embodiment, one embodiment of the present invention has been described. Other embodiments of the present invention are described in the other embodiments. Note that one embodiment of the present invention is not limited thereto. In other words, various embodiments of the invention are described in this embodiment and the other embodiments, and one embodiment of the present invention is not limited to a particular embodiment. Although an example in which a channel formation region, a source region, a drain region, or the like of a transistor includes an oxide semiconductor is described as one embodiment of the present invention, one embodiment of the present invention is not limited thereto. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor. Depending on circumstances or conditions, the transistor, the channel formation region of the transistor, the source and drain regions of the transistor, or the like does not necessarily include an oxide semiconductor. The example in which one embodiment of the present invention is applied to a memory cell is described; however, one embodiment of the present invention is not limited thereto. For example, one embodiment of the present invention may be applied to a circuit with another function depending on circumstances or conditions. Alternatively, for example, one embodiment of the present invention is not necessarily applied to a memory cell depending on circumstances or conditions.

<Notes on the Description of Drawings>

In this specification and the like, the terms for explaining arrangement, such as "over" and "under," are used for convenience to describe the positional relationship between components with reference to drawings. The positional relationship between components is changed as appropriate in accordance with a direction in which each component is described. Thus, the positional relationship is not limited to that described with a term used in this specification and can be explained with another term as appropriate depending on the situation.

The term "over" or "under" does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent of each other. However, in an actual circuit and the like, such components are sometimes hard to classify functionally, and there is a case in which one circuit is associated with a plurality of functions or a case in which a plurality of circuits are associated with one function. Therefore, the segmentation of blocks in a block diagram is not limited by any of the components described in the specification and can be differently determined as appropriate depending on the situation.

In the drawings, the size, the layer thickness, or the region is determined arbitrarily for description convenience; therefore, embodiments of the present invention are not limited to such a scale. Note that the drawings are schematically shown for clarity, and embodiments of the present invention are not limited to shapes or values shown in the drawings. For example, the following can be included: variation in signal, voltage, or current due to noise or difference in timing.

In drawings such as a top view (also referred to as a plan view or a layout view) and a perspective view, some of components might not be illustrated for clarity of the drawings.

<Notes on Expressions that can be Rephrased>

In this specification and the like, the terms "one of a source and a drain" (or a first electrode or a first terminal) and "the other of the source and the drain" (or a second electrode or a second terminal) are used to describe the connection relationship of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the term such as "electrode" or "wiring" does not limit the function of a component. For example, an "electrode" is used as part of a "wiring" in some cases, and vice versa. Moreover, the term "electrode" or "wiring" can also mean a combination of a plurality of "electrodes" or "wirings" formed in an integrated manner.

In this specification and the like, "voltage" and "potential" can be replaced with each other. The voltage refers to a potential difference from a reference potential. When the reference potential is a ground potential, for example, "voltage" can be replaced with "potential." The ground potential does not necessarily mean 0 V. Potentials are relative values, and a potential supplied to a wiring or the like is sometimes changed depending on the reference potential.

In this specification and the like, the terms "film," "layer," and the like can be interchanged with each other depending on circumstances or conditions. For example, the term "conductive layer" can be changed into the term "conductive film" in some cases. Moreover, the term "insulating film" can be changed into the term "insulating layer" in some cases.

<Notes on Definitions of Terms>

The following are definitions of the terms mentioned in the above embodiments.

<Switch>

In this specification and the like, a switch is conducting or not conducting (is turned on or off) to determine whether current flows therethrough or not. Alternatively, a switch has a function of selecting and changing a current path.

Examples of the switch include an electrical switch and a mechanical switch. That is, the switch is not limited to a certain element and any element can be used as long as it can control current.

Examples of the electrical switch include a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

An example of the mechanical switch is a switch formed using a micro electro mechanical systems (MEMS) technology, such as a digital micromirror device (DMD). Such a switch includes an electrode that can be moved mechanically, and operates by controlling conduction and non-conduction in accordance with movement of the electrode.

<Channel Length>

In this specification and the like, the channel length refers to, for example, the distance between a source and a drain in a region where a semiconductor (or a portion where current flows in a semiconductor when a transistor is on) and a gate overlap with each other or a region where a channel is formed in a top view of the transistor.

Note that in one transistor, channel lengths in all regions do not necessarily have the same value. In other words, the channel length of one transistor is not fixed to one value in some cases. Therefore, in this specification, the channel length is any one of values, the maximum value, the minimum value, or the average value, in a region where a channel is formed.

<Channel Width>

In this specification and the like, the channel width refers to, for example, the length of a portion where a source and a drain face each other in a region where a semiconductor (or a portion where a current flows in a semiconductor when a transistor is on) and a gate overlap with each other, or a region where a channel is formed.

Note that in one transistor, channel widths in all regions do not necessarily have the same value. In other words, the channel width of one transistor is not fixed to one value in some cases. Therefore, in this specification, the channel width is any one of values, the maximum value, the minimum value, or the average value, in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is increased in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

Therefore, in this specification, in a top view of a transistor, an apparent channel width that is the length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from the one obtained by calculation using an effective channel width is obtained in some cases.

<Connection>

In this specification and the like, the expression "A and B are connected" means the case where A and B are electrically connected to each other in addition to the case where A and B are directly connected to each other. Here, the expression "A and B are electrically connected" means the case where electric signals can be transmitted and received between A and B when an object having any electric action exists between A and B.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in that order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in that order." When the connection order in a circuit structure is defined by an expression similar to the above examples, a source (or a first terminal or the like) and a drain (or a second terminal or the like) of a transistor can be distinguished from each other to specify the technical scope.

This application is based on Japanese Patent Application serial No. 2016-073794 filed with Japan Patent Office on Apr. 1, 2016, the entire contents of which are hereby incorporated by reference.

What is claimed is:

1. A semiconductor device comprising:
   a context controller;
   a clock generation circuit;
   a programmable circuit; and
   a switch circuit,
   wherein the programmable circuit includes a programmable logic element,
   wherein the context controller is configured to detect context switch and generate a switch signal in accordance with the context switch,
   wherein the clock generation circuit is configured to generate a second clock signal,
   wherein a frequency of the second clock signal is lower than a frequency of a first clock signal, and
   wherein the switch circuit is configured to supply the first clock signal or the second clock signal to the programmable logic element in response to the switch signal.

2. The semiconductor device according to claim 1, wherein the context controller detects switching of a context control signal.

3. The semiconductor device according to claim 1, wherein the second clock signal is generated in a period during which the context switch is performed.

4. The semiconductor device according to claim 1, wherein the clock generation circuit comprises a frequency divider generating the second clock signal.

5. An electronic component comprising:
   the semiconductor device according to claim 1; and
   a lead electrically connected to the semiconductor device.

6. An electronic device comprising:
   the electronic component according to claim 5; and
   at least one of a display device, a touch panel, a microphone, a speaker, an operation key, and a housing.

7. A semiconductor device comprising:
   a context controller;
   a clock generation circuit;
   a programmable circuit; and
   a switch circuit, wherein the programmable circuit includes a programmable logic element,
wherein the context controller includes a detection circuit, a signal generation circuit, and a determination circuit,
wherein the detection circuit is configured to detect context switch,
wherein the signal generation circuit is configured to generate a context signal in accordance with the context switch,
wherein the determination circuit is configured to generate a switch signal in accordance with the context switch,
wherein the clock generation circuit is configured to generate a second clock signal,
wherein a frequency of the second clock signal is lower than a frequency of a first clock signal, and
wherein the switch circuit is configured to supply the first clock signal or the second clock signal to the programmable logic element in response to the switch signal.

8. The semiconductor device according to claim 7, wherein the detection circuit detects switching of a context control signal.

9. The semiconductor device according to claim 7, wherein the second clock signal is generated in a period during which the context switch is performed.

10. The semiconductor device according to claim 7, wherein the clock generation circuit comprises a frequency divider generating the second clock signal.

11. An electronic component comprising:
the semiconductor device according to claim 7; and
a lead electrically connected to the semiconductor device.

12. An electronic device comprising:
the electronic component according to claim 11; and
at least one of a display device, a touch panel, a microphone, a speaker, an operation key, and a housing.

13. A semiconductor device comprising:
a context controller;
a clock generation circuit;
a programmable circuit; and
a switch circuit,
wherein the programmable circuit includes a programmable logic element,
wherein the programmable logic element includes a flip-flop and a backup circuit capable of retaining data retained in the flip-flop,
wherein the context controller includes a detection circuit, a signal generation circuit, and a determination circuit,
wherein the detection circuit is configured to detect context switch,
wherein the signal generation circuit is configured to generate a context signal in accordance with the context switch,
wherein the determination circuit is configured to generate a switch signal in accordance with the context switch,
wherein the clock generation circuit is configured to generate a second clock signal and a third clock signal,
wherein a frequency of the second clock signal and a frequency of the third clock signal are lower than a frequency of a first clock signal,
wherein the clock generation circuit outputs the second clock signal in a period during which data is input from the flip-flop to the backup circuit and outputs the third clock signal in a period during which the data is input from the backup circuit to the flip-flop, and
wherein the switch circuit is configured to supply the first clock signal, the second clock signal, or the third clock signal to the programmable logic element in response to the switch signal.

14. The semiconductor device according to claim 13, wherein the detection circuit detects switching of a context control signal.

15. The semiconductor device according to claim 13, wherein the clock generation circuit comprises a first frequency divider generating the second clock signal and a second frequency divider generating the third clock signal.

16. The semiconductor device according to claim 15,
wherein the clock generation circuit further comprises a second switch circuit, and
wherein the second switch circuit is configured to switch and output the second clock signal or the third clock signal.

17. The semiconductor device according to claim 13,
wherein the backup circuit includes a first transistor and a second transistor,
wherein the first transistor includes an oxide semiconductor in a semiconductor layer serving as a channel formation region,
wherein one of a source and a drain of the first transistor is electrically connected to a gate of the second transistor, and
wherein the first transistor is capable of holding charge in the gate of the second transistor by turning off the first transistor.

18. An electronic component comprising:
the semiconductor device according to claim 13; and
a lead electrically connected to the semiconductor device.

19. An electronic device comprising:
the electronic component according to claim 18; and
at least one of a display device, a touch panel, a microphone, a speaker, an operation key, and a housing.

* * * * *